(12) United States Patent
LePoudre et al.

(10) Patent No.: US 11,792,961 B2
(45) Date of Patent: *Oct. 17, 2023

(54) BLENDED OPERATION MODE FOR PROVIDING COOLING TO A HEAT LOAD

(71) Applicant: Nortek Air Solutions Canada, Inc., Saskatoon (CA)

(72) Inventors: Philip Paul LePoudre, Saskatoon (CA); Christopher Regier, Saskatoon (CA); Marcel van den Hurk, Riverside Estates (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,841

(22) Filed: May 18, 2022

(65) Prior Publication Data

US 2022/0279675 A1 Sep. 1, 2022

Related U.S. Application Data

(63) Continuation of application No. 16/882,440, filed on May 23, 2020, now Pat. No. 11,375,641, which is a (Continued)

(51) Int. Cl.
*G06F 1/20* (2006.01)
*H05K 7/20* (2006.01)

(52) U.S. Cl.
CPC ......... *H05K 7/208* (2013.01); *H05K 7/20309* (2013.01); *H05K 7/20318* (2013.01); *H05K 7/20327* (2013.01); *H05K 7/20836* (2013.01)

(58) Field of Classification Search
CPC .......... H05K 7/20745; H05K 7/20836; H05K 7/20145; H05K 7/2079; H05K 7/20827;
(Continued)

(56) References Cited

U.S. PATENT DOCUMENTS 4,538,426 A * 9/1985 Bock .................. F24F 5/0035
261/151
7,093,452 B2 8/2006 Chee et al.
(Continued)

FOREIGN PATENT DOCUMENTS

CN 102192621 A 9/2011
CN 203908117 U 10/2014
(Continued)

OTHER PUBLICATIONS

"U.S. Appl. No. 16/764,702, Corrected Notice of Allowability dated Mar. 3, 2022", 3 pgs.
(Continued)

*Primary Examiner* — Mandeep S Buttar
(74) *Attorney, Agent, or Firm* — Schwegman Lundberg & Woessner, P.A.

(57) ABSTRACT

Conditioning systems and methods for providing cooling to a heat load can include an evaporative cooler arranged in a scavenger plenum with a recovery coil downstream of the evaporative cooler. The conditioning systems can operate in various modes, including an adiabatic mode and an evaporative mode, and a blended mode between the adiabatic mode and the evaporative mode, depending on environmental conditions. The blended mode can be enabled by a fluid transmission and retention device fluidically connected to the inlet and outlet of the evaporative cooler, the recovery coil outlet, and the heat load. The fluid transmission and retention device can variably distribute the cooling fluid exiting the recovery coil and the cooling fluid exiting the evaporative cooler to one or both of the heat load and the evaporative cooler inlet. In an example, the fluid transmission and retention device includes a manifold. In another example, the fluid transmission and retention device includes one or more tanks.

15 Claims, 11 Drawing Sheets

Related U.S. Application Data continuation-in-part of application No. 16/764,702, filed as application No. PCT/CA2018/051461 on Nov. 16, 2018, now Pat. No. 11,304,335.

(60) Provisional application No. 62/588,153, filed on Nov. 17, 2017.

(58) Field of Classification Search
CPC .......... H05K 7/20318; H05K 7/20309; H05K 7/20772; H05K 7/20736; H05K 7/20327; H05K 7/20381; H05K 7/208; H05K 7/20; G06F 1/20; G06F 2200/201; G06F 1/206; F24F 5/0035
USPC .............. 361/679.47, 679.53, 699, 688, 678, 361/679.46, 701, 679.49; 165/104.33, 165/287, 80.4; 62/310, 259.2
See application file for complete search history.

(56) References Cited

U.S. PATENT DOCUMENTS

| | | | |
|---|---|---|---|
| 9,091,496 B2 | 7/2015 | Imwalle et al. | |
| 9,278,303 B1* | 3/2016 | Somani | H05K 7/20745 |
| 11,304,335 B2 | 4/2022 | Lepoudre | |
| 11,375,641 B2* | 6/2022 | Lepoudre | H05K 7/20836 |
| 2005/0086958 A1 | 4/2005 | Walsh | |
| 2010/0058778 A1* | 3/2010 | Bhatti | F24F 3/1423 62/3.7 |
| 2011/0023506 A1 | 2/2011 | Day et al. | |
| 2013/0061624 A1 | 3/2013 | Zwinkels | |
| 2014/0260369 A1* | 9/2014 | LePoudre | F24F 5/0035 62/314 |
| 2015/0369527 A1* | 12/2015 | Ghadiri Moghaddam | F24F 3/1423 62/305 |
| 2017/0356661 A1* | 12/2017 | Fischer | F24F 3/153 |
| 2018/0073753 A1 | 3/2018 | Lepoudre et al. | |
| 2018/0012851 A1 | 5/2018 | Lepoudre et al. | |
| 2018/0128510 A1* | 5/2018 | LePoudre | F28D 15/00 |
| 2019/0113247 A1 | 4/2019 | Lepoudre et al. | |
| 2020/0284464 A1 | 9/2020 | Abdel-salam et al. | |
| 2020/0284480 A1 | 9/2020 | Tolouei Asbforoushani et al. | |
| 2020/0288602 A1 | 9/2020 | Lepoudre et al. | |
| 2020/0375060 A1 | 11/2020 | Lepoudre et al. | |
| 2021/0037677 A1 | 2/2021 | Lepoudre | |
| 2022/0210948 A1 | 6/2022 | Lepoudre | |

FOREIGN PATENT DOCUMENTS

| | | |
|---|---|---|
| CN | 107208910 A | 9/2017 |
| CN | 112204335 A | 1/2021 |
| CN | 115968435 A | 4/2023 |
| GB | 201306105 | 5/2013 |
| IN | 202017025172 A | 10/2020 |
| JP | 2003336866 A | 11/2003 |
| SG | 10202110166 | 10/2021 |
| WO | WO-2008138112 A1 | 11/2008 |
| WO | WO-2016183667 A1 | 11/2016 |
| WO | WO-2016183668 A1 | 11/2016 |
| WO | WO-2017097032 A1 | 6/2017 |
| WO | WO-2017152268 A1 | 9/2017 |
| WO | WO-2019095070 A1 | 5/2019 |
| WO | WO-2021232136 A1 | 11/2021 |

OTHER PUBLICATIONS

"U.S. Appl. No. 16/764,702, Notice of Allowance dated Jul. 21, 2021", 11 pgs.

"U.S. Appl. No. 16/764,702, Notice of Allowance dated Aug. 18, 2021", 7 pgs.

"U.S. Appl. No. 16/764,702, Notice of Allowance dated Dec. 10, 2021", 8 pgs.

"U.S. Appl. No. 16/764,702, Preliminary Amendment filed May 15, 2020", 10 pgs.

"U.S. Appl. No. 16/882,440, Non Final Office Action dated Sep. 22, 2021", 9 pgs.

"U.S. Appl. No. 16/882,440, Notice of Allowance dated Feb. 15, 2022", 9 pgs.

"U.S. Appl. No. 16/882,440, Response filed Jan. 24, 2022 to Non Final Office Action dated Sep. 22, 2021", 12 pgs.

"Chinese Application Serial No. 201880086028.8, Office Action dated Dec. 2, 2021", with English translation, 21 pages.

"European Application Serial No. 18879884.7, Extended European Search Report dated Jul. 2, 2021", 13 pgs.

"European Application Serial No. 18879884.7, Response to Communication Pursuant to Rules 161 and 162 filed Jan. 11, 2021", 17 pgs.

"Indian Application Serial No. 202017025172, First Examination Report dated Apr. 28, 2022", 6 pgs.

"International Application Serial No. PCT/CA2018/051461, International Search Report dated Jan. 23, 2019", 4 pgs.

"International Application Serial No. PCT/CA2018/051461, Written Opinion dated Jan. 23, 2019", 5 pgs.

"International Application Serial No. PCT/CA2020/050702, International Search Report dated Jan. 29, 2021", 3 pgs.

"International Application Serial No. PCT/CA2020/050702, Written Opinion dated Jan. 29, 2021", 3 pgs.

"U.S. Appl. No. 16/882,440, Corrected Notice of Allowability dated Jun. 2, 2022", 3 pgs.

"U.S. Appl. No. 17/697,612, Notice of Allowance dated Nov. 7, 2022", 13 pgs.

"Chinese Application Serial No. 201880086028.8, Office Action dated Dec. 5, 2022", w English Translation, 21 pgs.

"U.S. Appl. No. 17/697,612, Corrected Notice of Allowability dated Dec. 12, 2022", 3 pgs.

U.S. Appl. No. 16/764,702 U.S. Pat. No. 11,304,335, filed May 15, 2020, Blended Operation Mode for Providing Cooling to a Heat Load.

U.S. Appl. No. 17/697,612, filed Mar. 17, 2022, Blended Operation Mode for Providing Cooling to a Heat Load.

U.S. Appl. No. 16/882,440 U.S. Pat. No. 11,375,641, filed May 23, 2020, Blended Operation Mode for Providing Cooling to a Heat Load.

"U.S. Appl. No. 17/697,612, Notice of Allowance dated Mar. 9, 2023", 8 pgs.

"Chinese Application Serial No. 201880086028.8, Response filed Feb. 14, 2023 to Office Action dated Dec. 5, 2022", w/ English Claims, 31 pgs.

"Indian Application Serial No. 202017025172, Response filed Jan. 27, 2023 to First Examination Report dated Apr. 28, 2022", 29 pgs.

"International Application Serial No. PCT/CA2020/050702, International Preliminary Report on Patentability dated Dec. 1, 2022", 5 pgs.

\* cited by examiner

BLENDED OPERATION MODE FOR PROVIDING COOLING TO A HEAT LOAD

CLAIM OF PRIORITY

This application is a Continuation of U.S. patent application Ser. No. 16/882,440, filed on May 23, 2020, which is a Continuation in Part of U.S. patent application Ser. No. 16/764,702, filed on May 15, 2020, which is a U.S. National Stage Application of PCT Application No. PCT/CA2018/051461, filed on Nov. 16, 2018 and published on May 23, 2019 as WO 2019/095070, which claims the benefit of U.S. Provisional Patent Application No. 62/588,153, filed on Nov. 17, 2017, the benefit of priority of which is claimed hereby, and which are incorporated by reference herein in their entirety.

BACKGROUND

There are many applications where cooling is critical, such as, for example, data centers. A data center usually consists of computers and associated components working continuously (24 hours per day, 7 days per week). The electrical components in a data center can produce a lot of heat, which then needs to be removed from the space. Air-conditioning systems in data centers can often consume more than 40% of the total energy.

With the current data centers' air-conditioning systems and techniques and significant improvements in IT components operating conditions and processing capacity, servers can roughly operate at 50% of their capacity. This capacity limitation is due, in part, to the cooling systems not being able to cool the servers efficiently and the servers reach their high temperature limit before reaching their maximum processing capacity. High density data center cooling seeks to cool servers more effectively and increase the density of the data centers. Consequently, this will result in savings in data center operating cost and will increase the data center overall capacity.

OVERVIEW

The present application relates to conditioning systems and methods for providing cooling to a heat load. The conditioning systems can include different operating modes and selection of a particular mode can depend on the outdoor air or environmental conditions. The present inventor(s) recognized that additional benefits can be achieved through operating the conditioning system under a blended operation mode rather than shifting entirely from one discrete mode to another. The blended mode is a blend of the capacity/capability of the system between two standard modes of operation, including, for example, between an adiabatic and an evaporative mode.

The heat load that needs cooling can be any type of device or system that generates heat. The device or system can be enclosed or open to the atmosphere. In an example, the heat load can be from a data center. The conditioning systems and methods of the present application include an evaporative cooler arranged in a scavenger air plenum with a recovery coil arranged downstream of the evaporative cooler. The system is generally designed to deliver conditioned (e.g., cooled) liquid from one or both of the evaporative cooler and the recovery coil to the heat load. In some modes, the system is able to use only the recovery coil to cool the liquid and deliver all of the recovery coil liquid to the heat load. In such circumstances, the evaporative cooler can be completely bypassed and/or deactivated (and, in some cases, drained of liquid) to run in a dry or economizer mode, or the evaporative cooler can run in an adiabatic mode in which none (or nearly none) of the cooled liquid from the evaporative cooler is used for the heat load, and the cooling fluid exiting the evaporative cooler is, instead, returned to the inlet of the device.

Systems and methods according to this disclosure also include a fluid transmission and retention device fluidically connected to the inlet and outlet of the evaporative cooler, an outlet of the recovery coil, and the heat load. The fluid transmission and retention device is configured to variably distribute the cooling fluid exiting the recovery coil and the cooling fluid exiting the evaporative cooler to one or both of the heat load and the inlet of the evaporative cooler to allow the system to operate in an adiabatic mode, an evaporative mode, and a blended mode functionally and operatively between the adiabatic and evaporative modes. In some examples, the fluid transmission and retention device includes one or more tanks. In another example, the fluid transmission and retention device includes a manifold.

This overview is intended to provide an overview of subject matter in the present application. It is not intended to provide an exclusive or exhaustive explanation of the invention. The detailed description is included to provide further information about the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The conditioning systems and methods of the present application can include an evaporative cooler arranged in a scavenger air plenum with a recovery coil arranged downstream of the evaporative cooler. The conditioning systems and methods can include different operating modes including an economizer mode in which the evaporative cooler is off or bypassed, an adiabatic mode and an evaporative mode. Additional benefits can be achieved through operating under a blended operation mode that is a blend between the adiabatic and evaporative modes. In some examples, the conditioning systems can include a pre-cooler arranged upstream of the evaporative cooler for pre-conditioning the scavenger air. The inclusion of the pre-cooler can allow for additional operating modes. International Application No. PCT/CA2017/050180, published as WO 2017/152268, describes conditioning systems having these three components (pre-cooler, evaporative cooler, and recovery coil).

The conditioning systems and methods described herein can include a fluid transmission and retention device fluidically connected to the inlet and outlet of the evaporative cooler, an outlet of the recovery coil, and the heat load. The fluid transmission and retention device can enable operation in the blended mode. The fluid transmission and retention device is configured to variably distribute the cooling fluid exiting the recovery coil and the cooling fluid exiting the evaporative cooler to one or both of the heat load and the inlet of the evaporative cooler to allow the system to operate in the adiabatic mode, the evaporative mode, and the blended mode, as well as the economizer mode. As described below, the fluid transmission and retention device can include one or more tanks. In other examples described below, the fluid transmission and retention device can include a manifold.

Figure 1:
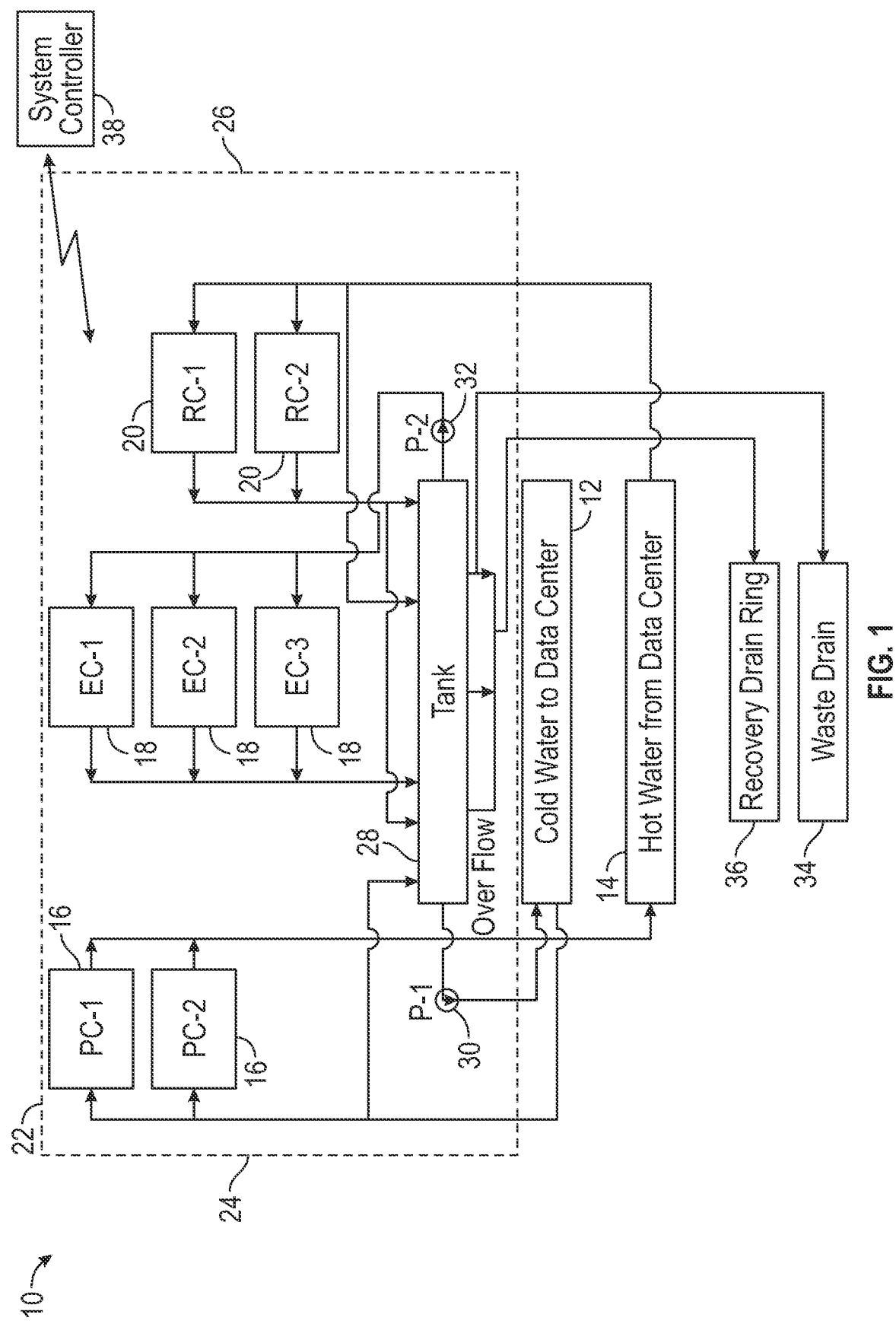
FIG. 1 is a schematic of an example conditioning unit for providing liquid cooling.

FIG. 1 illustrates a conditioning unit 10 that can be used to produce cold water for liquid cooling or air cooling of an enclosed space or a device. The conditioning unit 10 can operate in a blended mode between the adiabatic mode and the evaporative mode, as described below. In an example, the conditioning unit 10 can provide cooling to a data center. In an example, the conditioning unit 10 can be one of many units that make up a conditioning system to provide cooling to a heat load. In the application of data center cooling, for example, numerous units can make up the conditioning system to meet the heat load of the data center. The conditioning unit 10 can be in fluid connection with a hot water main and a cold water main, either or both of which can be dedicated to the conditioning unit or be in fluid connection with additional conditioning units. The cold-water main is indicated in FIG. 1 as cold water to data center (cold water 12) and the hot-water main is indicated in FIG. 1 as hot water from data center (hot water 14). In an example, large pipes (ring main) can be used to circulate the hot 14 and cold 12 water to and from the heat load.

The conditioning unit 10 can include one or more pre-coolers (PC) 16, one or more evaporative coolers (EC) 18, and one or more recovery coils (RC) 20. The one or more recovery coils 20 can also be referred to herein as dry coils or cooling coils. The one or more pre-coolers 16 can also be referred to herein as pre-cooling coils, pre-cooler coils, pre-conditioners or dry coils. The pre-coolers 16 can be referred to herein as first cooling components (upstream of the evaporative coolers 18) and the recovery coils 20 can be referred to herein as second cooling components (downstream of evaporative coolers 18).

The conditioning unit 10 can include a scavenger air plenum, indicated by a dotted line 22 in FIG. 1. The plenum 22 can include an air inlet 24 and an air outlet 26 through which a scavenger air stream can flow. The scavenger air plenum 22 can also be referred to as a housing, cabinet or structure and can be configured to house one or more components used to condition air or water. The plenum 22 can be disposed outside of an enclosed space having the heat load or located external to the devices that produce the heat load. The one or more pre-coolers 16, evaporative coolers 18 and recovery coils 20 can be arranged inside the plenum 22. In some examples, a filter (not shown) can be arranged inside the plenum 22 near the air inlet 24. In some examples, a fan or fan array (not shown) can be arranged inside the plenum 22 near the air outlet 26.

In the example conditioning unit 10 shown in FIG. 1, two pre-coolers 16 (PC-1, PC-2) are shown, three evaporative coolers 18 (EC-1, EC-2, EC-3) are shown, and two recovery coils 20 (RC-1, RC-2) are shown. It is recognized that more or less of each of the components (PC, EC, RC) can be included in the conditioning unit. As described above, the pre-cooler 16 can selectively operate depending on outdoor air conditions. In other example conditioning units, the pre-cooler 16 can be excluded.

As shown in FIG. 1, the conditioning unit 10 can include a tank 28 in fluid connection with a first pump 30 (P-1) and a second pump 32 (P-2). Water exiting the tank 28 can be delivered to the cold water main 12 via the first pump 30 (P-1). Water exiting the tank 28 can be delivered to the evaporative coolers 18 via the second pump 32 (P-2). The single tank 28 can be filled with water and thermal isolation can be created by managing the flow of warm and cold water into two pump suction bays, as described further below in reference to FIGS. 2-8. Cold water from the evaporative coolers 18 can be input into the tank. Warm or hot water from the recovery coils 20 can be input into the tank 28 through two different inlets, as represented by the two input arrows in FIG. 1 from the recovery coils 20 into the tank 28. The tank 28 can be located inside or outside the plenum 22. The pumps 30, 32 can be located inside or outside the plenum 22. The tank 28 can include one or more sensors for sensing and monitoring various parameters inside the tank 28, such as, for example, water level, water temperature, etcetera. The design of the tank 28 can also include overflow features as well as a waste drain 34 and a recovery drain ring 36.

The scavenger air entering the plenum 22 can pass through the one or more pre-coolers 16 to precondition the scavenger air. The scavenger air exiting the one or more pre-coolers 16 can then pass through the one or more evaporative coolers 18. The evaporative cooler 18 can be configured to condition the scavenger air passing there through using an evaporative fluid, such as water. The evaporative cooler 18 can use the cooling potential in both the air and the evaporative fluid to reject heat. In an example, as scavenger air flows through the evaporative cooler 18, the evaporative fluid, or both the scavenger air and the evaporative fluid, can be cooled to a temperature approaching the wet bulb (WB) temperature of the air leaving the pre-cooler 16. Due to the evaporative cooling process in the evaporative cooler 18, a temperature of the evaporative fluid at an outlet of the evaporative cooler 18 can be less than a temperature of the evaporative fluid at an inlet of the evaporative cooler 18; and a temperature of the scavenger air at an outlet of the evaporative cooler 18 can be less than a temperature of the scavenger air at an inlet of the evaporative cooler 18. In some cases, a temperature reduction of the evaporative fluid can be significant, whereas in other cases, the temperature reduction can be minimal. Similarly, a temperature reduction of the scavenger air can range between minimal and significant. In some cases, the scavenger air temperature can increase across the evaporative cooler 18. Such temperature reduction of one or both of the evaporative fluid and the scavenger air can depend in part on the outdoor air conditions (temperature, humidity), operation of the pre-cooler 16, and operation of the evaporative cooler 18. In an example, the evaporative cooler 18 can selectively operate adiabatically, in which case a temperature of the evaporative fluid circulating through the evaporative cooler 18 can remain relatively constant or undergo minimal changes.

The evaporative cooler 18 can be any type of evaporative cooler configured to exchange energy between an air stream and a cooling fluid through evaporation of a portion of the fluid into the air. Evaporative coolers can include direct-contact evaporation devices in which the working air stream and the liquid water (or other fluid) stream that is evaporated into the air to drive heat transfer are in direct contact with one another. In what is sometimes referred to as "open" direct-contact evaporation devices, the liquid water may be sprayed or misted directly into the air stream, or, alternatively the water is sprayed onto a filler material or wetted media across which the air stream flows. As the unsaturated air is directly exposed to the liquid water, the water evaporates into the air, and, in some cases, the water is cooled.

Such direct-contact evaporation devices can also include what is sometimes referred to as a closed-circuit device. Unlike the open direct-contact evaporative device, the closed system has two separate fluid circuits. One is an external circuit in which water is recirculated on the outside of the second circuit, which is tube bundles (closed coils) connected to the process for the hot fluid being cooled and returned in a closed circuit. Air is drawn through the recirculating water cascading over the outside of the hot tubes, providing evaporative cooling similar to an open circuit. In operation the heat flows from the internal fluid circuit, through the tube walls of the coils, to the external circuit and then by heating of the air and evaporation of some of the water, to the atmosphere.

These different types of evaporative coolers can also be packaged and implemented in specific types of systems. For example, a cooling tower can include an evaporative cooling device such as those described above. A cooling tower is a device that processes working air and water streams in generally a vertical direction and that is designed to reject waste heat to the atmosphere through the cooling of a water stream to a lower temperature. Cooling towers can transport the air stream through the device either through a natural draft or using fans to induce the draft or exhaust of air into the atmosphere. Cooling towers include or incorporate a direct-contact evaporation device/components, as described above.

Examples of evaporative coolers usable in the conditioning systems of the present application can also include other types of evaporative cooling devices, including liquid-to-air membrane energy exchangers. Unlike direct-contact evaporation devices, a liquid-to-air membrane energy exchanger (LAMEE) separates the air stream and the liquid water stream by a permeable membrane, which allows water to evaporate on the liquid water stream side of the membrane and water vapor molecules to permeate through the membrane into the air stream. The water vapor molecules permeated through the membrane saturate the air stream and the associated energy caused by the evaporation is transferred between the liquid water stream and the air stream by the membrane.

Some or all of the one or more evaporative coolers 18 can include a LAMEE as the evaporative cooler. The LAMEE can also be referred to herein as an exchanger or an evaporative cooler LAMEE. A liquid to air membrane energy exchanger (LAMEE) can be used as part of a heating and cooling system (or energy exchange system) to transfer heat and moisture between a liquid desiccant and an air stream to condition the temperature and humidity of the air flowing through the LAMEE. The membrane in the LAMEE can be a non-porous film having selective permeability for water, but not for other constituents that form the liquid desiccant. Many different types of liquid desiccants can be used in combination with the non-porous membrane, including, for example, glycols. The non-porous membrane can make it feasible to use desiccants, such as glycols, that had been previously determined to be unacceptable or undesirable in these types of applications. In an example, the membrane in the LAMEE can be semi-permeable or vapor permeable, and generally anything in a gas phase can pass through the membrane and generally anything in a liquid phase cannot pass through the membrane. In an example, the membrane in the LAMEE can be micro-porous such that one or more gases can pass through the membrane. In an example, the membrane can be a selectively-permeable membrane such that some constituents, but not others, can pass through the membrane. It is recognized that the LAMEEs included in the conditioning units disclosed herein can use any type of membrane suitable for use with an evaporative cooler LAMEE.

In an example, the LAMEE or exchanger can use a flexible polymer membrane, which is vapor permeable, to separate air and water. The water flow rate through the LAMEE may not be limited by concerns of carryover of water droplets in the air stream, compared to other conditioning systems. The LAMEE can operate with water entering the LAMEE at high temperatures and high flow rates, and can therefore be used to reject large amounts of heat from the water flow using latent heat release (evaporation).

The cooling fluid circulating through the LAMEE or exchanger can include water, liquid desiccant, glycol, other hygroscopic fluids, other evaporative liquids, and/or combinations thereof. In an example, the cooling fluid is a liquid desiccant that is a low concentration salt solution. The presence of salt can sanitize the cooling fluid to prevent microbial growth. In addition, the desiccant salt can affect the vapor pressure of the solution and allow the cooling fluid to either release or absorb moisture from the air. The concentration of the liquid desiccant can be adjusted for control purposes to control the amount of cooling of the scavenger air or cooling fluid within the LAMEE or exchanger.

Membrane exchangers may have some advantages over other types of evaporative coolers. For example, the LAMEE may eliminate or mitigate maintenance requirements and concerns of conventional cooling towers or other systems including direct-contact evaporation devices, where the water is in direct contact with the air stream that is saturated by the evaporated water. For example, the membrane barriers of the LAMEE inhibit or prohibit the transfer of contaminants and micro-organisms between the air and the liquid stream, as well as inhibiting or prohibiting the transfer of solids between the water and air. The use of LAMEEs along with an upstream or downstream cooling coil can result in a lower temperature of the water leaving the LAMEE and a higher cooling potential. Various configurations of cooling systems having a LAMEE can boost performance in many climates. Higher cooling potential and performance can result in lower air flow and fan power consumption in the cooling system, which is the main source of energy consumption in liquid-cooling systems. In an example in which the heat load is from a data center, this can increase the overall data center cooling system efficiency.

Depending upon the application and a number of factors, the evaporative cooler 18 can include any type of evaporative cooler configured to exchange energy between an air stream and a cooling fluid through evaporation of a portion of the fluid into the air.

In an example, the evaporative fluid from the evaporative cooler 18 can be collected and delivered to the tank 28 and thus can be used to provide cooling for the heat load. In other examples described herein, the evaporative fluid from the evaporative cooler 18 is not collected for cooling the heat load. In yet other examples, the conditioning system 10 can be configured to switch between a configuration in which the evaporative fluid exiting the evaporative cooler 18 is collected and transported to the tank 28 and operating the evaporative cooler 18 adiabatically to circulate the evaporative fluid through the evaporative cooler 18 only.

In an example, the evaporative fluid in the evaporative cooler 18 can be water or predominantly water. It is recognized that other types of evaporative cooling fluids can be used in combination with water or as an alternative to water in the conditioning systems described herein.

The dry coil or recovery coil 20 can be arranged inside the plenum 22 downstream of the evaporative cooler 18. The recovery coil 20 can cool a cooling fluid circulating through the recovery coil 20 using the cooling potential of the scavenger air. The scavenger air exiting the evaporative cooler 18 can be relatively cool and additional sensible heat from the cooling fluid passing through the recovery coil 20 can be rejected into the scavenger air. The recovery coil 20 can produce a reduced-temperature cooling fluid that can provide cooling to the heat load. The reduced-temperature cooling fluid exiting the recovery coil 20 can flow to the evaporative cooler 18 or the tank 28. The scavenger air exiting the recovery coil 20 can be directed out of the plenum 22 using one or more fans. The scavenger air can exit the plenum 22 as exhaust.

In an example, the cooling fluid circulating through the recovery coil 20 can be water. In an example, the cooling fluid circulating through the recovery coil 20 can be the same fluid as the evaporative fluid in the evaporative cooler 18.

As provided above, in an example, the evaporative fluid in the evaporative cooler 18 can be water. In an example, the reduced-temperature water from the outlet of the evaporative cooler 18 can be used to provide cooling to the heat load. The reduced-temperature water can flow from the evaporative cooler 18 to the tank 28.

The water from the tank 28 can provide cooling to the heat load by transporting the water to the heat load. The reduced-temperature water can provide cooling to the heat load using any known methods to reject heat from air or one or more devices, and such methods can include, but are not limited to, liquid immersing technology, cold plate technology, rear door heat exchangers, cooling distribution units (CDU), and cooling coils. In an example, the water can directly cool one or more components producing the heat load. The one or more components can include, but are not limited to, electrical components. In an example in which the heat load comes from an enclosed space, the water can pass through one or more cooling coils placed in a path of the supply air in the enclosed space, and the water in the cooling coils can sensibly cool the supply air.

After the water provides cooling to the heat load, the water can be recirculated back through the unit 10. The water can be at an increased-temperature after providing cooling to the heat load because the rejected heat from the heat load has been picked up by the water. The increased-temperature water can be transported to the recovery coil 20. The dry coil or recovery coil 20 can cool the water using the scavenger air exiting the evaporative cooler 18. At least a portion of the reduced temperature water can be sent to the tank 28, depending on an operating mode of the unit 10. In some instances, a portion of the reduced temperature water can be sent to the evaporative cooler 18.

In an economizer mode, all of the water from the recovery coil 20 can bypass the evaporative cooler 18 and go directly to the tank 28. The economizer mode or winter mode can enable the conditioning unit 10 to cool the water using the scavenger air and recovery coil 20, without having to run the evaporative cooler 18. In that situation, there may be no need for evaporation inside the evaporative cooler 18 since the cold outdoor air (scavenger air) can pass through the evaporative cooler 18 and sufficiently cool the water. The recovery coil 20 can also be referred to herein as an economizer coil since it can be a primary cooling source for the water in the economizer mode. Three modes of operation are described further below for operating the conditioning unit 10.

The one or more pre-coolers 16, located upstream of the evaporative cooler 18, can be used to pre-condition the scavenger air entering the plenum 22, prior to passing the scavenger air through the evaporative cooler 18. The pre-cooler 16 can be effective when the temperature of the water entering the pre-cooler 16 is lower than the outdoor air dry bulb temperature. The pre-cooler 16 can be used in typical summer conditions as well as in extreme summer conditions when the outdoor air is hot and humid. The pre-cooler 16 can depress the outdoor air wet bulb temperature, thus pre-cooling the scavenger air and heating the water. The pre-cooler 16 can provide more cooling potential in the evaporative cooler 18.

In an example, the pre-cooler 16 can use water from the tank 28 to condition the scavenger air. Because the pre-cooler 16 uses water from the tank 28 as the cooling fluid in the pre-cooler 16, the design of the pre-cooler 16 can be referred to as a coupled pre-cooler. In other words, the pre-cooler 16 is designed and configured to use a portion of the reduced-temperature water produced by the recovery coil 20 or the evaporative cooler 18 (and intended for cooling the heat load) as the cooling fluid for the pre-cooler 16. In other examples, a cooling fluid circuit for the pre-cooler 16 can be partially or wholly decoupled from the process circuit for the evaporative cooler 18 and recovery coil 20. In that case, the pre-cooler 16 can have an external cooling circuit partially or wholly separate from the reduced-temperature water produced by the evaporative cooler 18 or recovery coil 20 for process cooling.

The plenum 22 can include one or more sets of bypass dampers—for example, a first set of dampers can be located between the pre-cooler 16 and the evaporative cooler 18, and a second set of dampers can be located between the evaporative cooler 18 and the recovery coil 20. The use of the bypass dampers can direct the flow of scavenger air into the plenum 22 depending on the outdoor air conditions.

The conditioning unit 10 can operate in at least three modes and selection of the mode can depend, in part, on the outdoor air conditions and the heat load. When the outdoor air is cold, the conditioning unit can operate in a first mode, an economizer mode, and the pre-cooler 16 and the evaporative cooler 18 can be bypassed. The scavenger air can enter the plenum 22 downstream of the evaporative cooler 18 and pass through the recovery coil 20. This can protect the evaporative cooler 18 and avoid running the evaporative cooler 18 when it is not needed. In the first mode or economizer mode, the scavenger air can be cool enough such that the recovery coil 20 can provide all cooling to the water delivered to the tank 28 sufficient to provide cooling to the heat load, without needing to operate the evaporative cooler 18.

In a second operating mode, which can also be referred to as a normal mode or an evaporation mode, the pre-cooler 16 can be bypassed but the evaporative cooler 18 can be used. The evaporation mode can operate during mild conditions, such as spring or fall, when the temperature or humidity is moderate, as well as during some summer conditions. The scavenger air may be able to bypass the pre-cooler 16, while still meeting the cooling load. The scavenger air can enter the plenum 22 downstream of the pre-cooler 16 and pass through the evaporative cooler 18 and the recovery coil 20. In an example, the dampers can be excluded or may not be used in some cases. In such example, during the second operating mode, the scavenger air can pass through the pre-cooler 16 but the pre-cooler 16 can be turned off such that the water or cooling fluid is not circulating through the pre-cooler 16.

In a third operating mode, which can also be referred to as an enhanced mode or a super-evaporation mode, the conditioning unit 10 can run using both the pre-cooler 16 and the recovery coil 20. Under extreme conditions, or when the outdoor air is hot or humid, the unit 10 can provide pre-cooling to the scavenger air, using the pre-cooler 16, before the scavenger air enters the evaporative cooler 18. The pre-cooler 16 can be used to improve the cooling power of the unit 10, allowing the evaporative cooler 18 to achieve lower discharge temperatures. The pre-cooler 16 can reduce or eliminate a need for supplemental mechanical cooling. In an example, a portion of the water exiting the pre-cooler 16 can be directed to the evaporative cooler 18. In other examples, the cooling fluid circuit of the pre-cooler 16 can be decoupled from the evaporative cooler 18.

The conditioning system 10 can include a system controller 38 to control operation of the conditioning system 10 and control an amount of cooling provided from the cooling system 10 to the heat load (via the cold water 12). The system controller 38 can be manual or automated, or a combination of both. The conditioning system 10 can be operated so that a temperature of the water in the tank 28 can be equal to a set point temperature that can be constant or variable. In an example, instead of measuring/monitoring a temperature of the water in the tank, a temperature of the water after the water exits the tank (via the second pump 32) can be measured and compared to the set point temperature. The set point temperature can be determined based in part on the cooling requirements of the heat load. In an example, the set point temperature can vary during operation of the conditioning unit 10, based in part on operation of the data center or other devices that produce the heat load.

The system controller 38 can include hardware, software, and combinations thereof to implement the functions attributed to the controller herein. The system controller 38 can be an analog, digital, or combination analog and digital controller including a number of components. As examples, the controller 38 can include ICB(s), PCB(s), processor(s), data storage devices, switches, relays, etcetera. Examples of processors can include any one or more of a microprocessor, a controller, a digital signal processor (DSP), an application specific integrated circuit (ASIC), a field-programmable gate array (FPGA), or equivalent discrete or integrated logic circuitry. Storage devices, in some examples, are described as a computer-readable storage medium. In some examples, storage devices include a temporary memory, meaning that a primary purpose of one or more storage devices is not long-term storage. Storage devices are, in some examples, described as a volatile memory, meaning that storage devices do not maintain stored contents when the computer is turned off. Examples of volatile memories include random access memories (RAM), dynamic random access memories (DRAM), static random access memories (SRAM), and other forms of volatile memories known in the art. The data storage devices can be used to store program instructions for execution by processor(s) of the controller 38. The storage devices, for example, are used by software, applications, algorithms, as examples, running on and/or executed by the controller 38. The storage devices can include short-term and/or long-term memory, and can be volatile and/or nonvolatile. Examples of non-volatile storage elements include magnetic hard discs, optical discs, floppy discs, flash memories, or forms of electrically programmable memories (EPROM) or electrically erasable and programmable (EEPROM) memories.

The system controller 38 can be configured to communicate with the conditioning system 10 and components thereof via various wired or wireless communications technologies and components using various public and/or proprietary standards and/or protocols. For example, a power and/or communications network of some kind may be employed to facilitate communication and control between the controller 38 and the conditioning system 10. In one example, the system controller 38 can communicate with the conditioning system 10 via a private or public local area network (LAN), which can include wired and/or wireless elements functioning in accordance with one or more standards and/or via one or more transport mediums. In one example, the system 10 can be configured to use wireless communications according to one of the 802.11 or Bluetooth specification sets, or another standard or proprietary wireless communication protocol. Data transmitted to and from components of the conditioning unit 10, including the controller 38, can be formatted in accordance with a variety of different communications protocols. For example, all or a portion of the communications can be via a packet-based, Internet Protocol (IP) network that communicates data in Transmission Control Protocol/Internet Protocol (TCP/IP) packets, over, for example, Category 5, Ethernet cables.

The system controller 38 can include one or more programs, circuits, algorithms or other mechanisms for controlling the operation of the conditioning system 10. For example, the system controller 38 can be configured to modulate the speed of one or more fans in the plenum 22 and/or control actuation of one or more valves to direct cooling fluid from the outlet of one or more components of the unit 10 to the tank 28. The system controller 38 can also be configured to operate the system 10 in the modes described herein.

Figure 2:
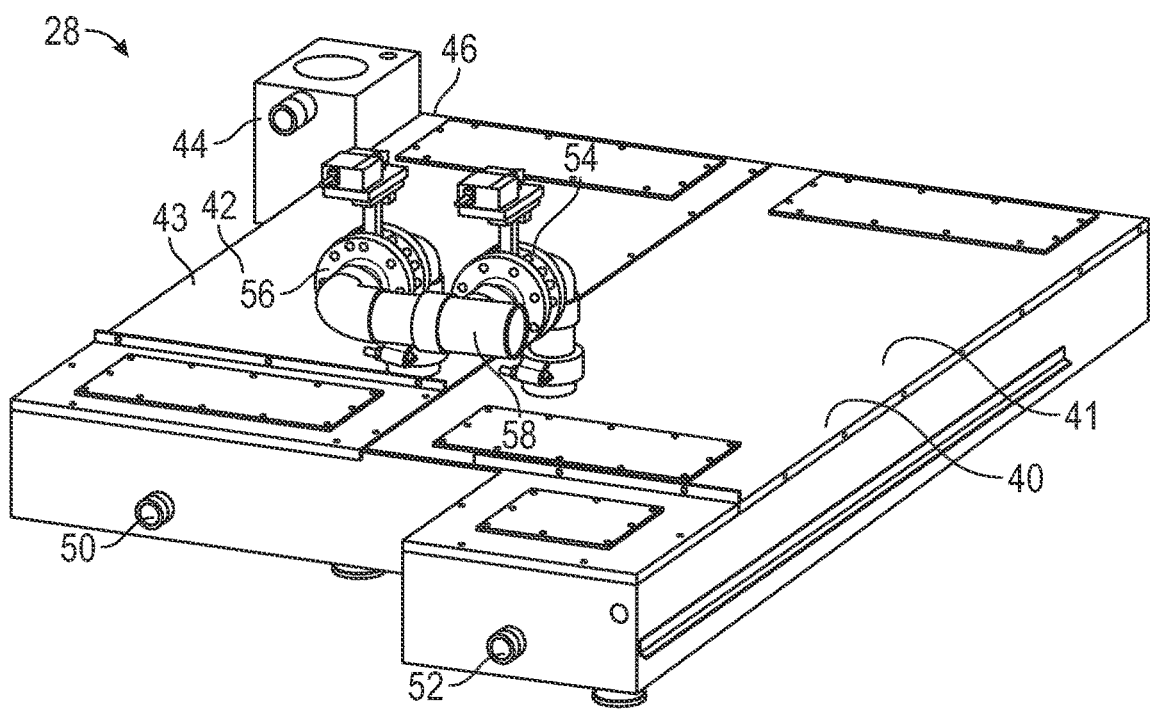
FIG. 2 is a perspective view of an example tank for use in the conditioning unit of FIG. 1.
Figure 3:
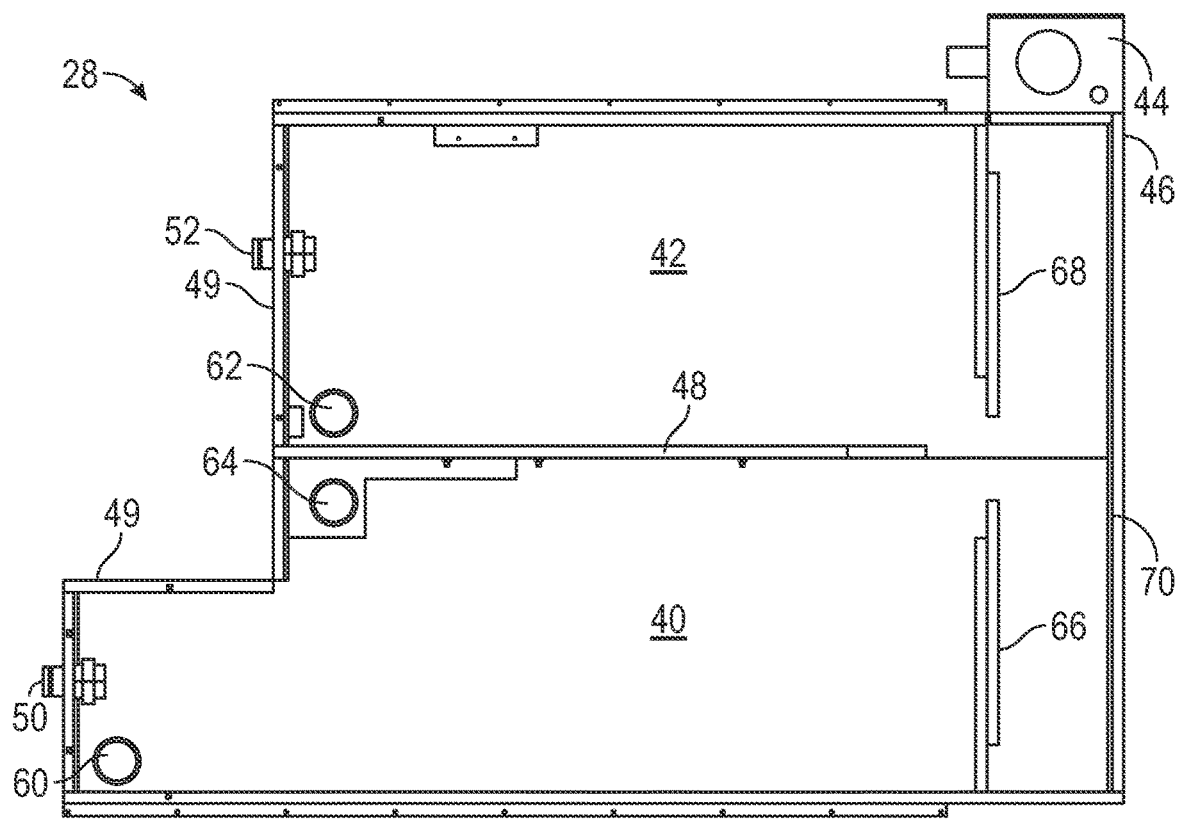
FIG. 3 is a top view of the tank of FIG. 2.

FIG. 2 shows an example of the design of the tank 28 of FIG. 1. The tank 28 can include a first pump suction bay 40, having a first cover 41, and a second pump suction bay 42, having a second cover 43. FIG. 3 shows a top view of the tank 28 of FIG. 2 with the covers 41, 43 removed to show interior features of the tank 28. The water exiting the evaporative cooler can enter the tank 28 through a discharge break tank 44 at a back end 46 of the tank 28 and the water can be generally free to flow into either of the pump bays 40, 42. Such water from the evaporative cooler can be referred to herein as cold discharge water or EC discharge water. The back end 46 of the tank can also be referred to herein as a discharge area since such area of the tank 28 receives the discharge water from the evaporative cooler. The break tank 44 can be used for back pressure control and energy dissipation. The tank 28 can include a dividing baffle 48 for separation of the first and second pump bays 40, 42. A front end 49 of the tank 28 can include a first pump suction inlet 50 for the first pump suction bay 40 and a second pump suction inlet 52 for the second pump suction bay 42.

The tank 28 is configured such that each pump suction bay 40, 42 can receive return water from the recovery coil and the amount of return water delivered to each suction bay 40, 42 can be varied via a corresponding valve 54, 56, respectively. FIG. 2 shows a portion of piping 58 from the recovery coil. Although such return water from the recovery coil has been circulated through the recovery coil before being delivered to the tank 28, such return water can still be relatively warm or hot in some cases (depending on outdoor air conditions), and thus is referred to herein as hot return water or RC return water. It is recognized that under some outdoor air conditions such return water can be cool or relatively cold. Such return water is also referred to herein as RC discharge water. The distribution or ratio of hot return water delivered to each pump suction bay 40, 42 can be regulated as described below. The design shown in FIG. 2 includes two modulating two-way valves 54 and 56. In other designs, a three-way valve (see FIG. 8) can be used to control the distribution of return water to the two suction bays 40, 42.

Each of the bays 40, 42 can include a recovery drain 60, 62, respectively. An overflow drain/weir 64 can be included at the front end 49 of the tank 28 in the second pump suction bay 42.

The first pump suction inlet 50 can be used to transfer water out of the first bay 40 and to the first pump 30 such that water can be pumped to the cold water main 12 to provide cooling to the data center or other heat load. The second pump suction inlet 52 can be used to transfer water out of the second bay 42 and to the second pump 32 such that water can be recirculated back to the evaporative coolers 18.

When the conditioning unit 10 is operating, essentially all of the tank 28 can be full of water, provided that some air space is needed in the tank 28 to facilitate level control and fluctuations in the tank 28. Thermal isolation can be accomplished in the tank 28, at least in part, by controlling the delivery of the hot return water from the recovery coil 20 into the two suction bays 40, 42 and managing the flow currents in the tank 28 to prevent convective mixing. As shown in FIG. 3, the dividing baffle 48 is used to physically separate at least a portion of the suction bays 40, 42 from one another. It is recognized that the dividing baffle 48 can be excluded from the tank 28 and other designs/features can be used as an alternative or in addition to the baffle 48 to thermally isolate the two suction bays 40, 42.

The tank 28 can include a diverter 66, 68 in each of the bays 40, 42, respectively. The EC discharge water can enter the tank 28 through the break tank 44 and flow into the space between the diverters 66, 68 and a back wall 70 of the tank 28. An opening exists between the diverters 66, 68 and between an end of the baffle 48 and the diverters 66, 68. These openings allow the cold water entering the tank 28 to flow into the bays 40, 42. Such openings can be fixed or variable. For example, the baffle 48 can include a sliding plate such that the distance between the end of the baffle 48 and the diverters 66, 68 can be changed.

For the hot return water (from the recovery coil) entering the suction bays 40, 42 through valves 54, 56, such hot return water can be added into suction bays 40, 42 using different fluid designs and features to manage how the hot return water is introduced into the suction bays 40, 42. Examples of such designs/features are described below in reference to FIGS. 4-7.

Figure 4:
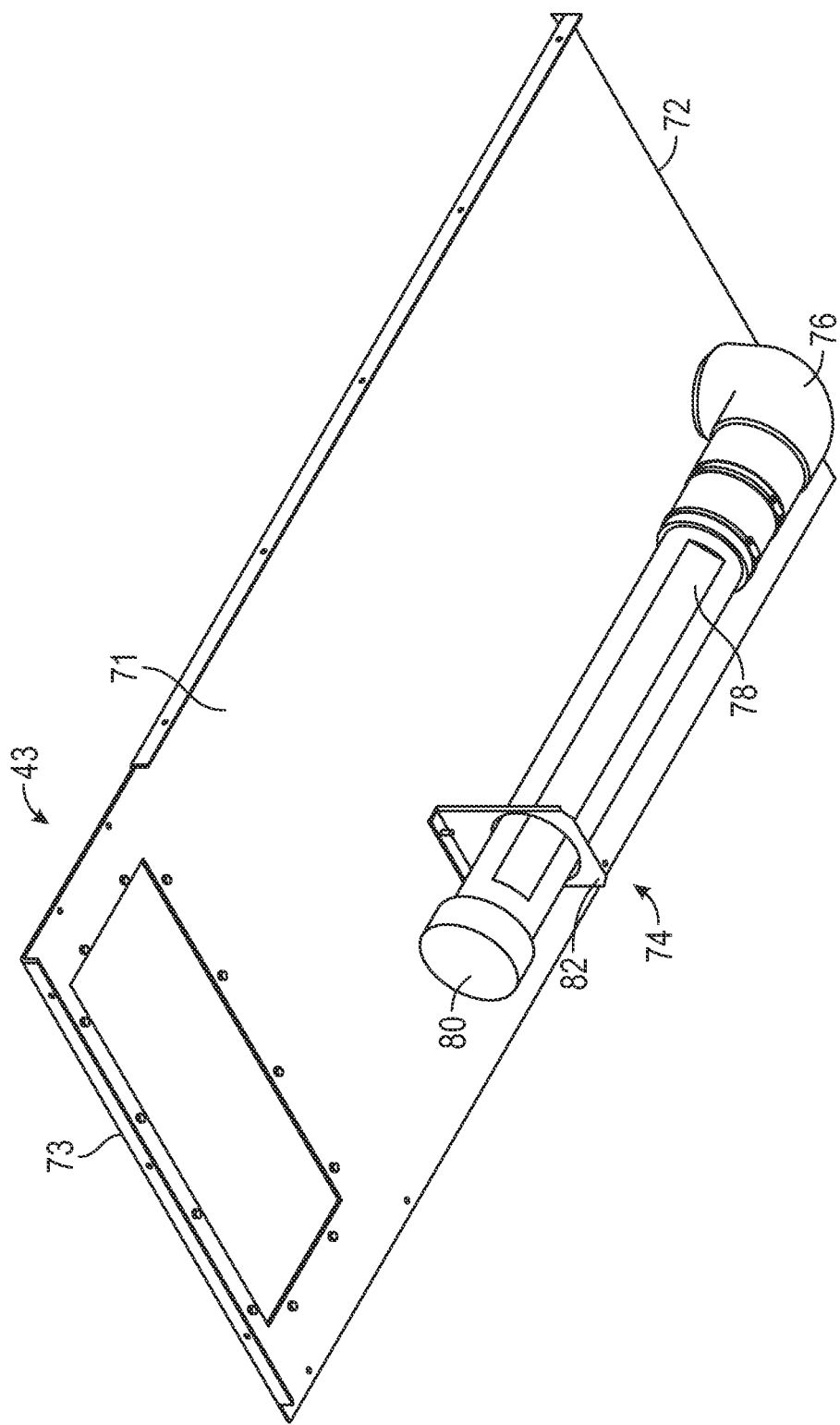
FIG. 4 is a perspective view of a portion of the tank of FIG. 2.

FIG. 4 shows an underside 71 of the cover 43 for the second pump suction bay 42. The cover 43 can have a front end 72 that is aligned with the front end 49 of the 28 tank (when the cover 43 is on the tank 28) and a back end 73 that is aligned with the back end 46 of the tank 28 (when the cover 43 is on the tank 28). FIG. 4 also shows a discharge pipe 74. The discharge pipe 74 can be connected to the valve 56 and piping 58 shown in FIG. 2 such that hot return water from the recovery coil can flow through the piping 58 and into the discharge pipe 74. The discharge pipe 74 can deliver the hot return water into the second pump suction bay 42. The discharge pipe 74 can include an elbow 76, tubing 78, and cap 80. In an example, a hanger 82 can be used to attach the tubing 78 to the underside 71 of the cover 43.

Figure 5:
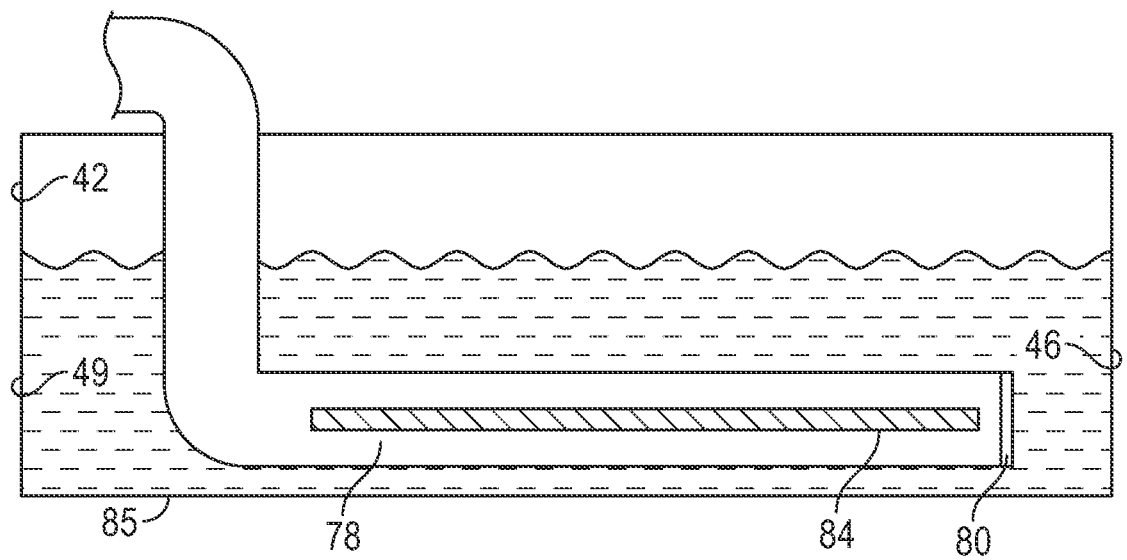
FIG. 5 is a simplified schematic showing a side view of a discharge tube of the tank.
Figure 6:
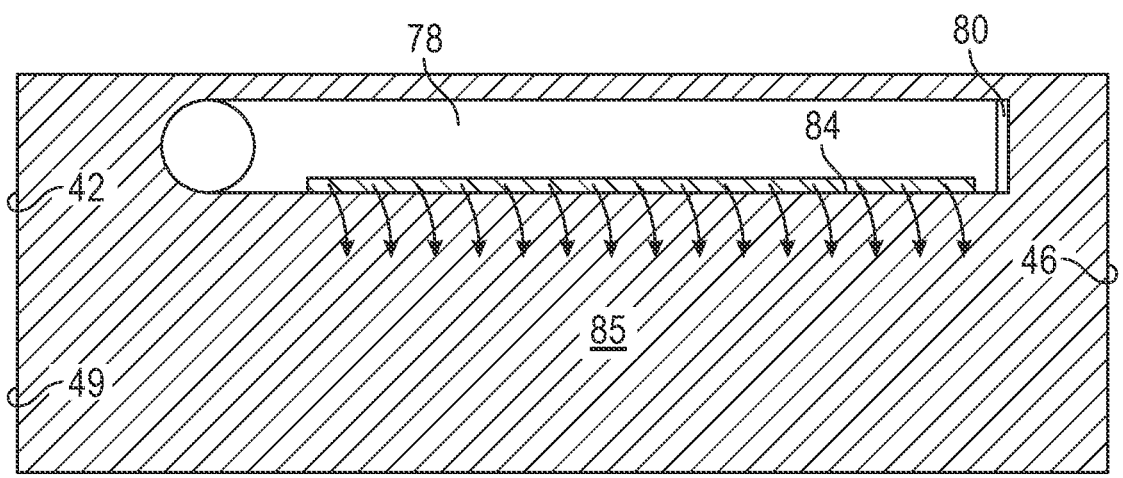
FIG. 6 is a simplified schematic showing a top view of the discharge tube of the tank.

In an example, the tubing 78 can include a diffuser slot 84 formed in the tubing 78 for releasing/delivering the hot return water from the discharge pipe 74 and into the pump suction bay 42. FIGS. 5 and 6 show a simplified schematic of the pump suction bay 42 and the discharge pipe 74 to illustrate the diffuser slot 84. FIG. 5 is a side view of the discharge pipe 74 and FIG. 6 is a top view of the discharge pipe 74. In the example shown in FIGS. 5 and 6, the diffuser slot 84 can be formed in a side of the discharge pipe 74 at an angle of approximately 45 degrees, relative to a bottom surface 85 of the tank 28. As such, the water exiting the pipe 74 through the slot 84 hits the bottom 85 of the tank 28 at an angle. In another example, the tubing 78 can be oriented such that the slot 84 faces the bottom 85 of the tank 28. It is recognized that various positions of the slot 84 can be used to direct the water exiting the pipe 74 in a particular direction.

It is recognized that other angles and configurations of the diffuser slot 84 can be used for the discharge pipe 74. The discharge pipe 74 is designed to control an orientation and/or direction at which the water is introduced into the bay 42. It can be important to direct the hot return water toward the pump inlet 52. It can be important to control, and in some cases, minimize a velocity at which the hot return water is introduced into the bay 42, to minimize turbulence inside the bay 42. For example, if the slot 84 points toward the bottom of tank 28, turbulence of the water at or near the surface of the water in the tank 28 can be minimized or prevented.

As shown in FIGS. 5 and 6, the slot 84 is an elongated slot formed in the tubing 78. In an example, a majority of the total length of the tubing 78 includes the slot 84. It is recognized that a length and width of the slot 84 can be determined based in part on a target velocity of the water exiting through the slot 84. Although not specifically shown, the first pump suction bay 40 can include a similar discharge pipe to the discharge pipe 74 shown in FIG. 4.

Figure 7:
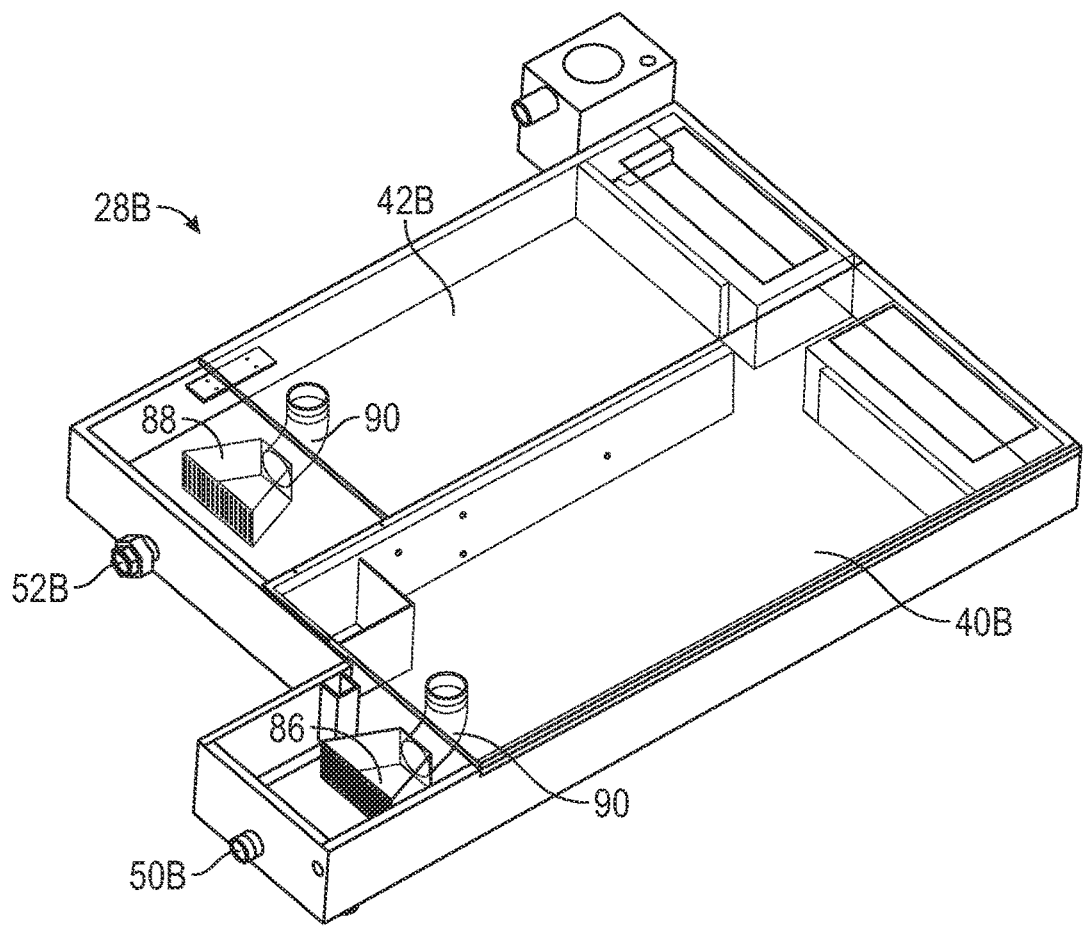
FIG. 7 is a perspective view of an example tank for use in the conditioning unit of FIG. 1.

FIG. 7 illustrates another example of a tank 28B that can be used in the conditioning system 10. FIG. 7 is an alternative design for introducing the hot return water from the recovery coil into first and second pump suction bays 40B, 42B. The tank 28B can be generally similar to the tank 28 described above and shown in FIGS. 2-6. The tank 28B can include the same general design and features with the exception that instead of the discharge pipe 74 shown in FIGS. 4-6, the tank 28B can include a first diffuser 86 in the first pump suction bay 40B and a second diffuser 88 in the second pump suction bay 42B. The first and second diffusers 86, 88, in combination with an elbow 90 connected to each of the diffusers 86, 88, are designed to slow down the fluid flow or reduce the velocity of the water as it is released into the respective bay 40B and 42B, and to direct the water to pump suction inlets 50B and 52B. A particular location for the diffusers 86, 88 within the respective bay 40B, 42B can vary depending in part on a target velocity of the water existing the diffuser 86, 88 and a desired distance of the diffusers 86, 88 from the respective pump suction inlet 50B, 52B.

Additional features can be used in addition to or as an alternative to those included in the design of the tank 28, 28B in FIGS. 2-7 to control the distribution and flow of water in the tank 28, 28B and through the first and second pumps 30, 32 (P-1, P-2).

Figure 8:
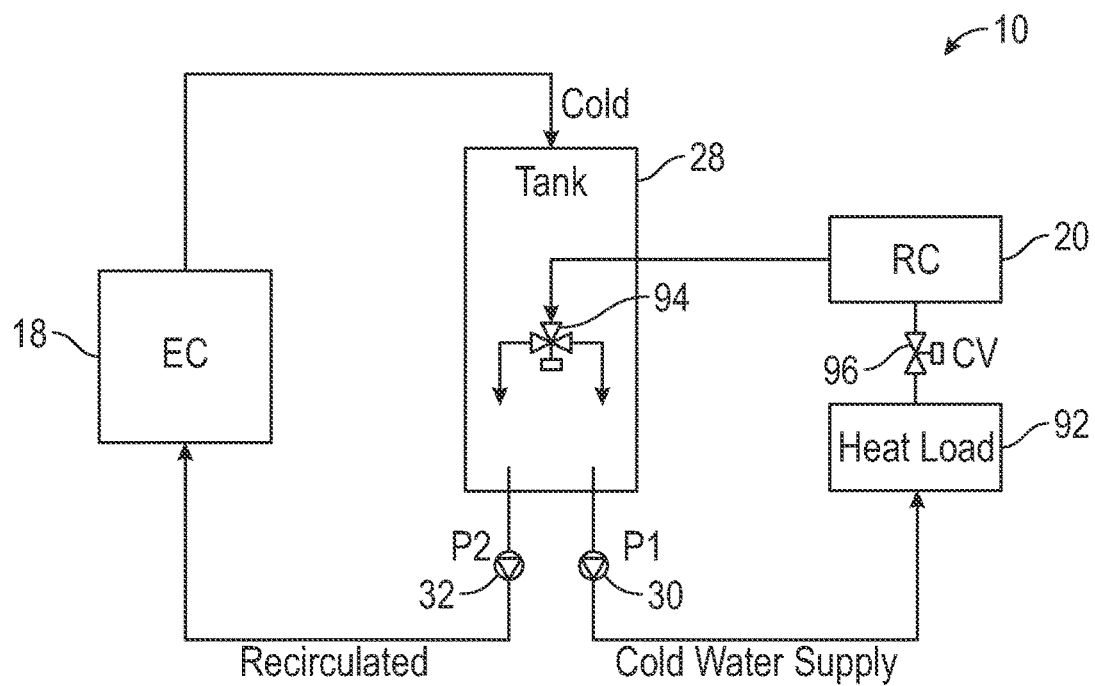
FIG. 8 is a simplified schematic of the conditioning unit of FIG. 1.

FIG. 8 is a simplified schematic of the conditioning unit 10 including the tank 28 and the fluid flow paths into and out of the tank 28. FIG. 8 also schematically shows the evaporative cooler (EC) 18, recovery coil (RC) 20 and heat load 92, relative to the various flow paths. The distribution of the hot return water from the RC 20 to the first and second pump suction bays can depend on an operating mode of the conditioning system 10. For simplicity, FIG. 8 does not show the structural components of the tank 28, including the first and second pump suction bays. Thus, for the description below of operating in the various modes, reference is made to the other figures included herein and described above. FIG. 8 can be applicable to various designs of the tank 28, including the example shown in FIGS. 4-6 or the example shown in FIG. 7.

FIG. 8 shows a three-way valve 94 for modulating a flow from the RC 20 to the first and second pump suction bays of the tank 28. The three-way valve 94 can be used in place of the two-way valves 54, 56 shown in FIG. 2.

In the economizer mode, one or both of the valves 54, 56 (or one or both sides of the valve 94) can be open such that the return water from the recovery coil 20 can flow through the valves 54, 56 (or both sides of the valve 94) into either suction bay 40, 42 of the tank 28. The economizer mode operates in conditions in which the outdoor air can sufficiently cool the hot water from the heat load 92. Thus the temperature of the return water from the recovery coil 20 in the economizer mode is not warm or hot in the outdoor air conditions under which the economizer mode is used. After the water from the recovery coil 20 flows into the tank 28, all supply water can be pumped by the first pump 30 (P-1) to the cold water main 12. In the economizer mode, the second pump 32 (P-2) can be off since the evaporative cooler 18 is not used in that operating mode. The tank level can be sensed by a tank level sensor and controlled in part by an RC-fill valve 96 (or control valve, CV).

In the adiabatic mode, the water from the recovery coil 20 can flow only through the valve 54 into the first suction bay 40. In contrast to the economizer mode, the second pump 32 (P-2) can be on in the adiabatic mode and the second pump 32 (P-2) can pump a recirculating flow of water through the evaporative cooler 18 and back into the tank 28 via the break tank 44. The rear or back 46 of the tank 28 can be flooded with cold water. Generally all or close to all of the cold water from the EC 16 can naturally flow into the second pump suction bay 42 since the first pump suction bay 40 can be supplied with water from the recovery coil 20. Under the single tank design, the adiabatic mode is not a completely closed fluid circuit; however, the control of the flow of water in the tank 28 as described immediately above can generally separate the EC discharge water from the recovery coil return water.

In the evaporative mode, all water from the recovery coil 20 can be diverted through the valve 56 into the second pump suction bay 42. Because the second pump suction bay 42 is filled with hot water, the cold discharge water from the evaporative cooler 16 can naturally flow into the first pump suction bay 40. The flow of cold water into the first pump suction bay 40 can be in proportion to a pumping rate of the first pump 30 (P-1), with any remaining water flowing back to the second pump suction bay 42. To ensure that all the RC return water flows to the second pump inlet 52, a flow rate of the second pump 32 (P-2) should be greater than a flow rate of the first pump 30 (P-1). An overall tank level can be controlled by the RC-fill valve 96.

The blended mode operation can involve varying the distribution of hot return water from the recovery coil 20 into the two pump suction bays 40,42 and corresponding pump suction inlets 50, 52, and consequently varying the mix ratio of warm and cold water into the pumped cold water supply (to the heat load 92) via the pump 30 and into the pumped recirculated water (to the evaporative cooler 16) via the pump 32. The valves 54, 56 (or the 3-way valve 94) can control the proportion of hot return water going into the suction inlets 50, 52 for the pumps 30, 32, respectively (P-1, P-2).

The conditioning unit 10 can be controlled to maintain a supply water temperature set point under varying ambient air conditions or varying cooling loads. The conditioning unit 10 accomplishes this by varying the mix ratio of EC discharge water and RC return water into the pump suction bays 40, 42. For example, if the conditioning unit 10 enters the wet mode of operation in the equivalent of the adiabatic mode (100% of RC return water into the first pump suction 40 and 100% evaporative cooler discharge into the second pump suction 42) and the ambient outdoor air conditions rise (increased temperature or humidity), the supply water temperature delivered by the first pump 30 (P-1) may rise above the set point. In this case, the controller 38 of the unit 10 can begin to modulate the RC return valves 54, 56 to divert a portion of the return water into the second pump suction bay 42, which can cause an equivalent portion of cold EC discharge water to flow into the first pump suction bay 40, lowering the supply water temperature to the set point. The mix ratio can be continuously modulated by the controller 38 to maintain supply water temperature set point in response to varying ambient conditions and load. At peak ambient conditions or peak cooling loads the conditioning unit 10 may operate in the equivalent of the evaporative mode (100% of RC return water into P-2 suction, and P-1 suction being supplied essentially all by EC discharge water).

If a pre-cooler 16 is included in the conditioning unit 10, the pre-cooler 16 can selectively be used in any of the adiabatic mode, evaporative mode, or blended mode. When the pre-cooler 16 is used in the evaporative mode, the operating mode can be referred to as an enhanced or super-evaporation mode. The pre-cooler 16 can precondition the outdoor air and can be effective particularly in hot or humid conditions.

The modulation of the water mix ratio can be used to control the supply water temperature and evaporation rate in the evaporative cooler 18. Because capacity modulation can be accomplished by varying water mix ratio, airflow modulation may not be needed in the evaporative (wet) mode of operation. When the conditioning unit transitions from the economizer mode to the wet mode, the air flow rate (fan speed) can be held constant, and the supply water temperature can be controlled by the mix ratio. The conditioning unit 10 can be optimized for power or water efficiency by changing the fan speed setting in the wet mode. The highest water efficiency occurs when the fan speed is maximized, and the highest power efficiency occurs when the fan speed is minimized.

The mixing of the EC discharge water (entering the break tank 44) and the RC discharge water (entering into one or both of the suction bays 40,42) can be varied in order for the water at the first suction pump inlet 50 to be at or near the setpoint temperature. As the outdoor air conditions change, the temperature of the EC discharge water changes. Similarly, the temperature of the RC discharge water changes as a function of the outdoor air conditions. Thus the mix ratio of the two water sources (EC discharge water and RC discharge water) provided to the first pump suction inlet 50 is changing to achieve the temperature for the cold water supply from the first pump 30.

At peak cooling, the unit 10 can be controlled to minimize any warm water (RC discharge water) going into the first pump suction inlet 50 for delivery by the first pump 30. If the flow rate of the second pump 32 is high or increased, the hot/warm water can be drawn into the second pump 32 and any cold water can flow to the back 46 of the tank 28 at which point it can be available to be withdrawn from the tank 28 by the first pump 30.

The system controller 38 can make various adjustments in order to maintain the supply water temperature (from the first pump 30) at or near the setpoint temperature, based on the demands of the heat load 92 and outdoor air conditions. In an example, the water mix ratio can be adjusted in discrete steps (for example, 10%, 20%, 30%, etc.), and the precise control of the supply water temperature can be done by air flow modulation (for example, via one or more fans). In another example, the air flow rate can be fixed and the water mix ratio can be precisely modulated such that the supply water temperature stays at or near the set point temperature. It is recognized that additional parameters can be controlled to maintain the supply water temperature at or near the setpoint temperature. Another possible control parameter can include, for example, varying the flow rate through the evaporative cooler.

Figure 9:
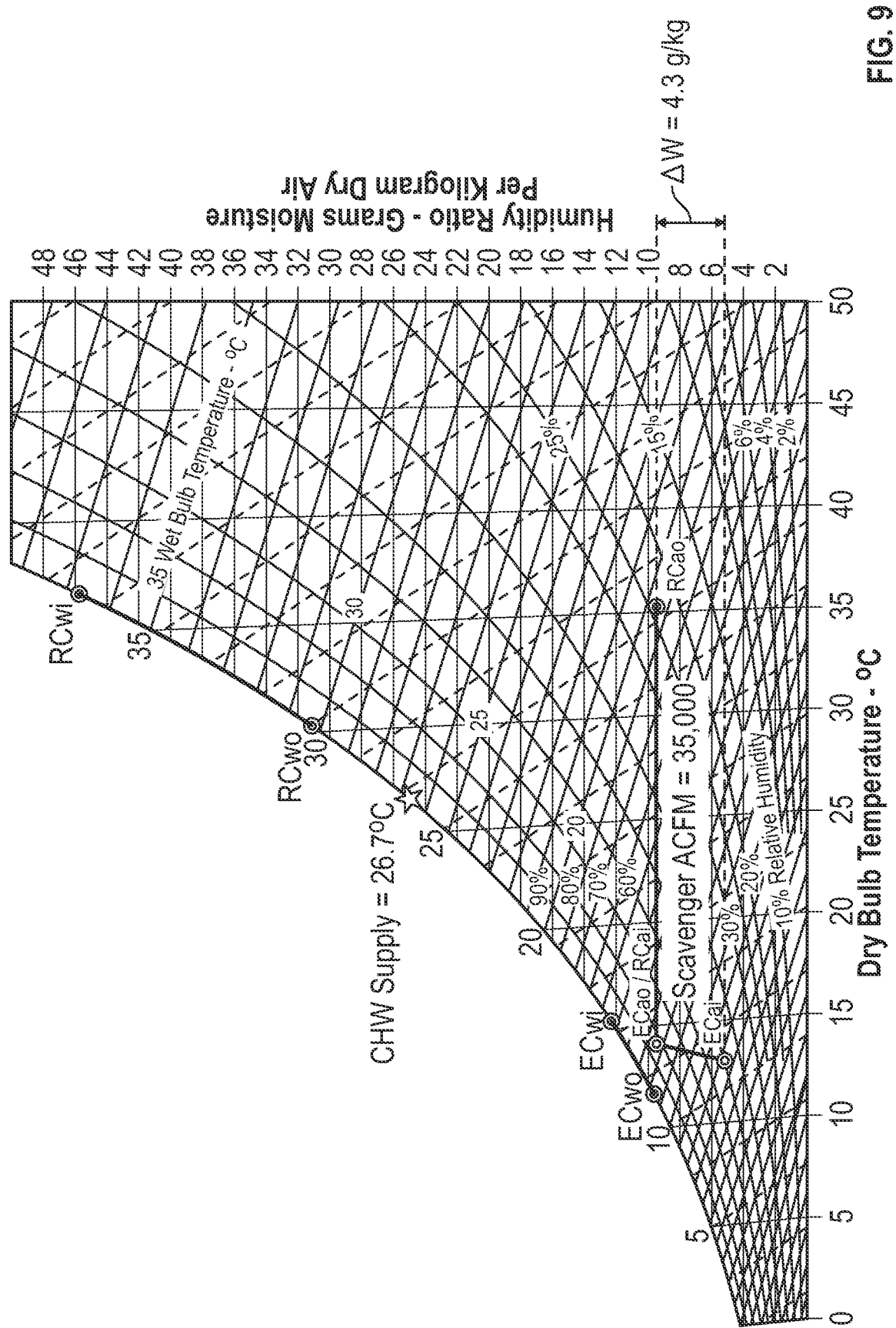
FIG. 9 is a psychometric chart of a conditioning unit operating in an adiabatic mode.
Figure 10:
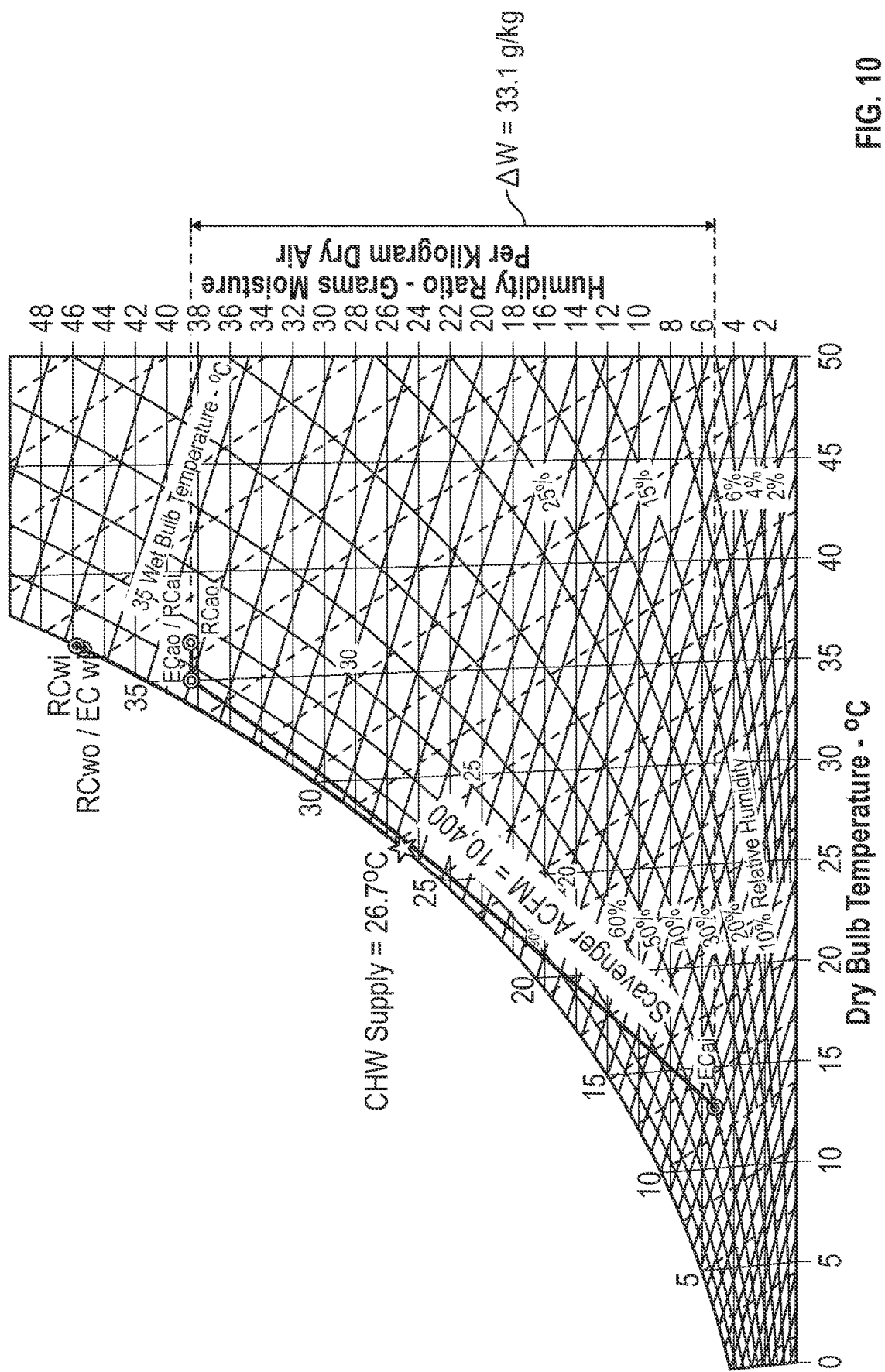
FIG. 10 is a psychometric chart of the conditioning unit of FIG. 9 operating under the same outdoor air conditions but in an evaporation mode.

FIGS. 9 and 10 are psychometric charts for conditionings units operating without the blended mode and under the same outdoor air conditions. FIG. 9 shows the conditioning unit operating under the adiabatic mode for a particular set of outdoor or ambient air conditions. FIG. 10 shows the same conditioning unit operating under the evaporative mode under that same set of outdoor or ambient air conditions. Under both modes, the conditioning unit is able to provide sufficient cooling such that the cold water supply to the heat load is at or near the set point temperature of 26.7 degrees Celsius. The evaporative cooler (EC) in the conditioning unit of FIGS. 9 and 10 is a liquid-to-air membrane energy exchanger (LAMEE). ECwi is the water at the inlet of the evaporative cooler. ECwo is the water at the outlet of the evaporative cooler. ECai is the air at the inlet of the evaporative cooler. ECao is the air at the outlet of the evaporative cooler. Similarly, RCwi is the water at the inlet of the recovery coil, and RCwo is the water at the outlet of the evaporative cooler. RCai is the air at the inlet of the evaporative cooler. RCao is the air at the outlet of the evaporative cooler.

In the adiabatic mode, the water circuits for the EC and the RC are generally separate. In the adiabatic mode shown in FIG. 9, the majority of the heat rejection is occurring in the recovery coil. The fans have to ramp up to a scavenger air flow rate of 35,000 ACFM. In contrast, in the evaporative mode shown in FIG. 10, the majority of the cooling is provided by the evaporative cooler. The water at the inlet of the evaporative cooler is the same as the water at the outlet of the RC, as shown in FIG. 10. The water outlet temperature of the evaporative cooler is not visible in FIG. 10 since it is at or near the set point temperature of 26.7 degrees Celsius. Although the fans can be ramped down in the evaporative mode to a scavenger air flow rate of 10,400 ACFM, the conditioning unit consumes much more water under the evaporative mode shown in FIG. 10, as compared to the adiabatic mode of FIG. 9.

FIGS. 9 and 10 illustrate the operating extremes of the adiabatic mode and the evaporative mode under a particular set of outdoor air conditions in which each mode can handle the heat load but at the expense of power consumption or water consumption. Moreover, switching from the adiabatic mode to the evaporative mode or vice versa as the outdoor air conditions change can result in significant changes in how the conditioning unit is operated. The blended operation mode can provide significant advantages when it is used in the outdoor or ambient air conditions shown in FIGS. 9 and 10. The blended operation mode can provide finer control and stability and can continue to be used as changes in the outdoor air changes are occurring, without having to fully cross over from the adiabatic mode to the evaporative mode or vice versa.

The capability to operate in the blended mode, as described herein, is applicable to any operation with evaporative cooling or cooling towers. In addition to the advantages provided above, such blended mode can provide smooth control of the unit cooling capacity and supply water temperature in the wet mode of operation. As such, the supply water temperature can be controlled more precisely.

Figure 11:
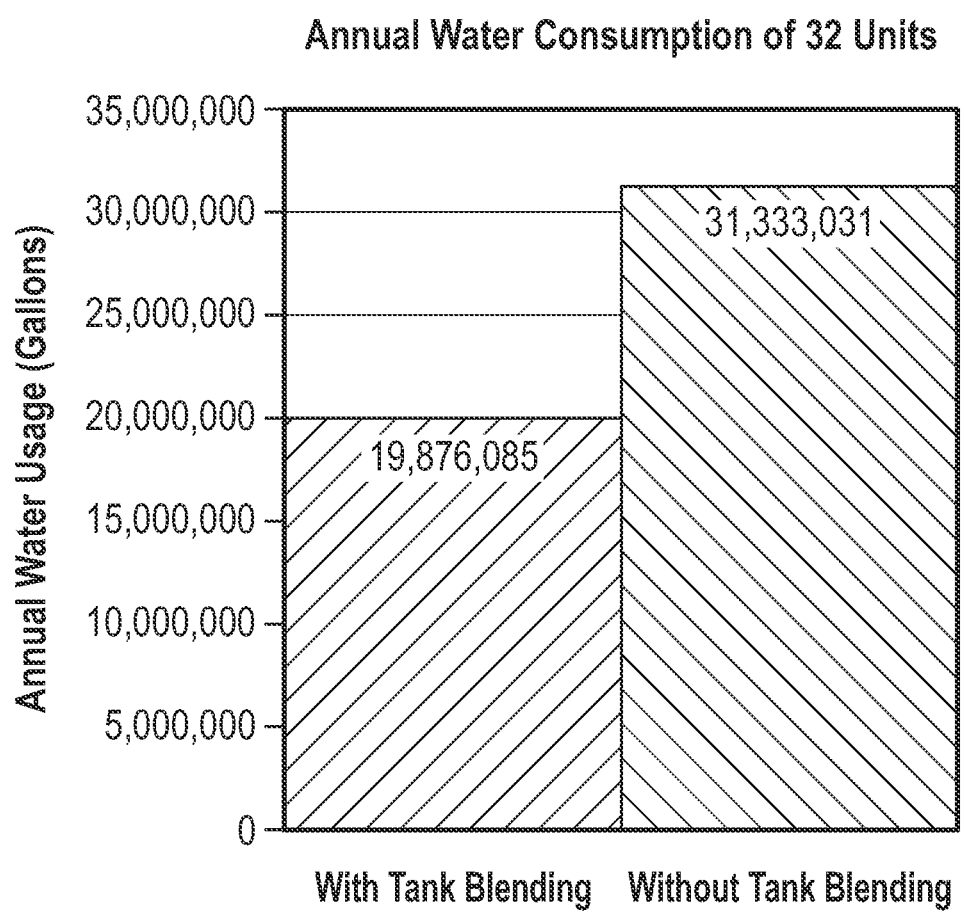
FIG. 11 is a chart comparing annual water usage of two different conditioning systems.

The blended mode can result in higher annual water usage efficiency of the conditioning unit or overall conditioning system. FIG. 11 shows modeling results of the annual water consumption of two systems, each of which have 32 units. Each of the 32 units can be similar to the conditioning unit 10 of FIG. 1 and the evaporative cooler can include a LAMEE. The system with the tank blending capabilities described herein is projected to consume 19.9 million gallons of water annually. The system without tank blending is projected to consume 31.3 million gallons of water annually. Thus the system having multiple units with a blended operation mode exhibited more than a 35% reduction in annual water usage as compared to a conditioning system having the same number of units, but without blended operation.

Figure 12:
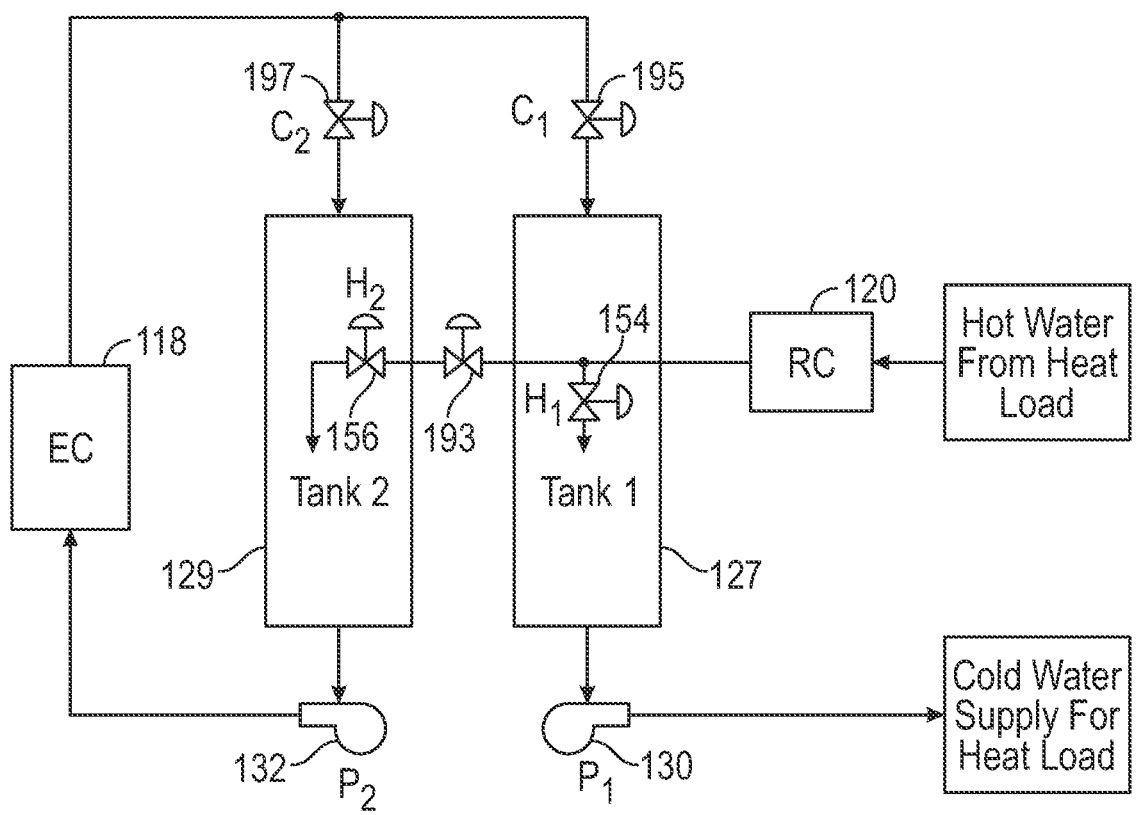
FIG. 12 is a simplified schematic of another example conditioning unit.

FIG. 12 is a simplified schematic (similar to FIG. 8) of a conditioning unit 100 that can be configured and operate similarly to the conditioning unit 10. The conditioning unit 100 can include an evaporative cooler 118 (EC) and a recovery coil 120 (RC). It is recognized that, like the conditioning unit 100 having multiple evaporative coolers and multiple recovery coils (see FIG. 1), EC 118 and RC 120 of FIG. 12 can represent one or more of that particular component. Also, the conditioning unit 100 can include one or more pre-coolers (see the pre-coolers 16 of FIG. 1) even though not included in FIG. 8.

Instead of a single tank design, the conditioning unit 100 can include two tanks—a first tank 127 and a second tank 129. The two tanks 127, 129 can be used to regulate a flow of hot water from the RC 120 into each of the tanks 127, 129, as well as to regulate a flow of cold water from the EC 118 into each of the tanks 127, 129. The conditioning unit 100 can include a system controller similar to the controller 38 of the conditioning unit 10. The conditioning unit 100 can include an equalization valve 193 located between the first and second tanks 127, 129.

The first tank 127 can be referred to as the "cold" tank since the water from the first tank 127 is delivered via a first pump 130 as the cold water supply for the heat load. The second tank 129 can be referred to as the "hot" tank since the water from the second tank 129 is delivered via a second pump 132 for recirculation through the EC 118. The flow of RC return water from the recovery coil 20 to the first and second tanks 127, 129 can generally be the same as described above in reference to the delivery of RC return water to the first and second pump suction bays 40, 42 of the tank 28. FIG. 12 includes a first valve 154 for the first tank 127 and a second valve 156 for the second tank 129. The first valve 154 can be a first hot water valve (H1) and the second valve 156 can be a second hot water valve (H2). It is recognized that in another example, the unit 100 can include a three-way modulating valve for varying and controlling the flow of RC return water to the first and second tanks 127, 129.

The conditioning unit 100 can include two cold water valves—a first cold water valve 195 and a second cold water valve 197. The first cold water valve 195 can be configured to deliver EC water to the first tank 127 and the second cold water valve 197 can be configured to deliver EC water to the second tank 129. The system controller for the conditioning unit 100 can vary and control the amounts of cold water delivered into each of the tanks 127, 129, depending on an operating mode of the unit 100.

In an economizer mode, the RC return water can flow through the valve 154 and into the first tank 127 and then can be pumped to the cold water main using the pump 130. The outdoor air conditions under the economizer mode can be such that the RC return water can be used as cold water supply for the heat load.

In an adiabatic mode, the first tank 127 can continue to operate as described in the paragraph immediately above in reference to the economizer mode. The second tank 129 can be filled with the water exiting the EC 118 and the second pump 132 can recirculate the water from the second tank 129 back through the EC 118. The equalization valve 193 can remain closed during operation in the adiabatic mode. As similarly described above for operation of the unit 10 in the adiabatic mode, the water circuits for the recovery coil 120 and the evaporative cooler 118 can remain essentially separate from one another in the adiabatic mode. The level in the second tank 129 can be sensed via a sensor and make up water can be supplied to the second tank 129 as needed.

In an evaporative mode, the equalization valve 193 can be open to fluidly connect the two tanks 127, 129 and the RC return water can be supplied to the second tank 129 through the second valve 156. The EC water can be delivered into the first tank 127 via the first cold water valve 195 at a flow rate in proportion to the pumping rate of the first pump 130. Any remaining EC water can flow into the second tank 129 via the second cold water valve 197. Overall tank operating level can be controlled by a RC-fill valve similar to the RC fill valve 96 of FIG. 8.

In a blended operation mode, between the adiabatic mode and the evaporative mode, the first and second hot water valves 154, 156 can be modulated to vary the distribution of the RC return water to the first and second tanks 127, 129. As described above in reference to the unit 10 and a single tank design, the blended operation mode can continuously monitor and adjust the distribution of the RC return water to the first and second tanks 127, 129 such that the cold water supply temperature to the heat load (as delivered from the tank 127 via the pump 130) is at or near the set point temperature. In an example, the distribution ratio can be continuously varied (and finely tuned) and the scavenger air flow rate through the conditioning unit can be relatively constant. Under the blended operation mode, the mix of hot return water from the RC 120 and cold discharge water from the EC 118 can be adjusted such that the water supply temperature is at or near the set point temperature. The amount of cold discharge water entering each of the tanks 127, 129 can depend in part on the amount of hot return water entering each of the tanks 127, 129 via the valves 154, 156.

In the single tank design, the back end or discharge area of the tank 28 can receive the EC discharge water or cold water, and such discharge area of the tank 28 can be fluidly connected to each of the first and second bays 40, 42 of the tank. In the two-tank design, each tank 127, 129 can include a discharge area that can be in fluid connection with the area of the tank 127, 129 that receives the RC return water via the valves 154, 156.

In an example, the first and second tanks 127, 129 can be wholly separate structures from one another. In another example, the first and second tanks 127, 129 can be part of the same structure, but physically separated by a wall or other physical divider that runs a length of the tanks 127 and 129 (as compared to the dividing baffle 48 of the tank 28 which does not run an entire length of the tank 28).

The two-tank design shown in FIG. 12 may provide better thermal isolation as compared to the tank 28, since the two-tank design can prevent undesirable mixing of the cold and hot water under particular operating modes. The two-tank design can include additional equipment, including an additional tank, piping and valves, and consequently additional parameters to control, relative to the single tank design.

Figure 13:
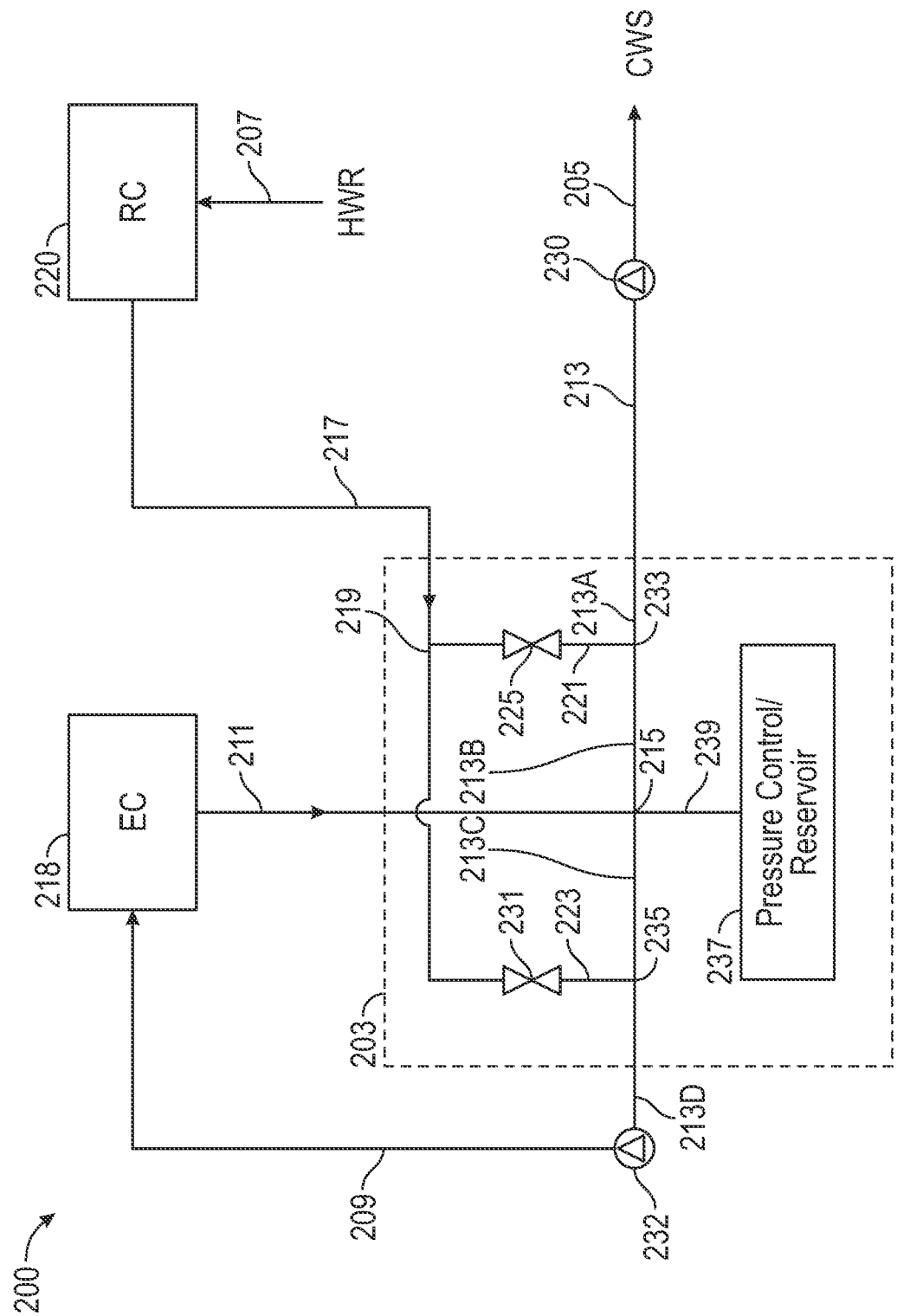
FIG. 13 is a schematic of another example conditioning unit having a manifold for operation in the various modes.

FIG. 13 is a schematic of a conditioning unit 200 that can be configured to generally operate similar to the conditioning units 10 and 100 to provide cooling. The conditioning unit 200 can have a different system for operating in the blended mode, compared to the conditioning units 10 and 100. The conditioning unit 200 can include an evaporative cooler 218 (EC) and a recovery coil 220 (RC). It is recognized that, like the conditioning unit 100 having multiple evaporative coolers and multiple recovery coils (see FIG. 1), EC 218 and RC 220 of FIG. 13 can represent one or more of those particular components. The conditioning unit 200 can include one or more pre-coolers (see the pre-coolers 16 of FIG. 1) even though not included in FIG. 13.

The conditioning unit 200 can include a manifold 203, rather than a one or two tank design, for enabling the unit 200 to operate in the blended mode between the adiabatic mode and the evaporative mode. The manifold 203 can offer additional benefits, as provided below, to the design and operation of the conditioning unit 200.

As described above in reference to the conditioning units 10 and 100, the unit 200 can provide cold water to a heat load. Such cold water can come from the evaporative cooler 218 or the recovery coil 220, depending on an operating mode of the unit 200. The cold water can be pumped to the heat load via a first pump 230 as cold water supply (CWS) through a water line 205. After providing cooling to the heat load, the water can be returned to the recovery coil 220 as hot water (HWR in FIG. 13) via a line 207. A second pump 232 can supply water to the evaporative cooler 218 via an inlet line 209. The supply water to the evaporative cooler 218 can be recirculated water from the evaporative cooler 218 or water from the recovery coil 220, depending on the operating mode. The first pump 230 can be included within the conditioning unit 200 or external to the conditioning unit 200. In an example, the cold water supply can be drained from the unit 200 and into external piping, and the pump 230 can be a distribution pump located external to the unit 200.

The manifold 203 can enable distribution of water to the first pump 230 and the second pump 232 from the evaporative cooler 218 and the recovery coil 220. The manifold 203 can include an EC conduit 211 (also referred to as an EC discharge line 211) and a main conduit 213 (also referred to as common piping 213). The EC conduit 211 and the main conduit 213 can be connected; such connection can include, for example, a T-junction 215, as shown in FIG. 13. The main conduit 213 can include four piping sections 213A, 213B, 213C and 213D, described below. The manifold 203 can include a RC discharge line 217, which can include a junction 219 for the water from the RC discharge line 217 to be distributed to piping 221 and/or piping 223, depending on the operating mode. The piping 221 can be a first RC conduit and include a first valve 225 and the piping 223 can be a second RC conduit and include a second valve 231. The piping 221 can connect to the main conduit 213 at a junction 233 between piping sections 213A and 213B. The piping 223 can connect to the main conduit 213 at a junction 235 between sections piping 213C and 213D. The manifold 203 can include a pressure control device 237 in fluid connection with the main conduit 213 via connector piping 239 (or reservoir conduit 239). The connector piping/reservoir conduit 239 can be a short pipe that connects with the main conduit 213 at or in proximity to the junction 215 between the EC conduit 211 and the main conduit 213.

In an example and as shown in FIG. 13, the pressure control device 237 can be a reservoir for holding water. Other types of pressure control devices or regulators can be used in the manifold 203 for controlling the pressure at the junction 215 in order to control a back pressure of the evaporative cooler 218. This is described further below.

The piping section 213A can be located between the first pump 230 and the junction 233. The piping section 213B can be located between the junction 233 and the junction 215. The piping section 213C can be located between the junction 215 and the junction 235. The piping section 213D can be located between the junction 235 and the second pump 232.

The design of the piping in the manifold 203, as well as the valves 225 and 231, can enable the distribution and control of water from the evaporative cooler 218 and recovery coil 220 to the first and second pumps 230, 232, depending on the operating mode. The main conduit 213 and the valves 225 and 231 can be used to effectively control the flow of water through the unit 200 and such flow varies as a function of the operating mode. The valves 225 and 231 can be part of a flow control system for variably distributing the flow of water from the recovery coil outlet to the heat load and the evaporative cooler 218.

Under the adiabatic mode, essentially all or nearly all of the water from the evaporative cooler 218 can flow into the main conduit 213 and through the second pump 232 for recirculation back to the evaporative cooler. In this mode, the second valve 231 can be completely closed and the first valve 225 can be completely open such that essentially all of the water exiting the recovery coil 220 in the RC discharge line 217 can flow through the first valve 225 and into the piping section 213A, then into the first pump 230 for delivery to the heat load.

Under the evaporative mode, essentially all or nearly all of the water from the evaporative cooler 218 can flow into the piping sections 213A and 213B and through the first pump 230 for delivery to the heat load. In this mode, the first valve 225 can be completely closed and the second valve 231 can be completely open such that essentially all of the water in the RC discharge line 217 can flow through the second valve 231 and into the piping section 213D, then into the second pump 232 for circulation through the evaporative cooler 218 via the line 209.

Under the blended mode, a portion of the recovery coil water in the discharge line 217 can go to the heat load and the remaining portion can go to the evaporative cooler 218. Similarly, a portion of the evaporative cooler water in the EC conduit 211 can go to the heat load and the remaining portion can be recirculated through the evaporative cooler 218. As such, the first and second valves 225, 231 can both be partially open and the particular position of each valve can be determined based on the ratio of water from the recovery coil 220 and the evaporative cooler 218 to the heat load. Such ratio can vary during operation in the blended mode in order to maintain the supply water temperature set point, as described above in reference to the conditioning unit 10. The conditioning unit 200 can include a system controller that can function similar to the controller 38 to continuously modulate the mix ratio in response to changing ambient conditions and load. The flow control system or device for controlling the valves 225, 231 can be part of the system controller or in communication with the system controller.

The position of the first and second valves 225, 231 in the blended mode can control the distribution of water from the recovery coil 220 to the first pump 230 and the second pump 232. More specifically, the position of the valves 225, 231 can control the distribution of water from the recovery coil 220 to the heat load and to the evaporative cooler 218. In the blended mode, the water to the heat load is a mix of water from the recovery coil 220 and water from the evaporative cooler 218; similarly, the water to the inlet of the evaporative cooler 218 (via the line 209) is a mix of water from the recovery coil 220 and water from the evaporative cooler 218 that is recirculated back through the evaporative cooler. The water exiting the evaporative cooler 218 in the EC conduit 211 can flow towards the pump 230 (via the section 213B) and/or the pump 232 (via the section 213C) once the evaporative cooler outlet water reaches the junction 215. The distribution of such water from the evaporative cooler 218 can depend on the amount of the recovery coil outlet water going to each of pumps 230 and 232. Each of pumps 230 and 232 can have a set flow rate, and such flow can include recovery coil outlet water, evaporative cooler outlet water or both. Thus, after accounting for the recovery coil outlet water (controlled via valves 225 and 231), the remaining water to be drawn into each of the pumps 230 and 232 can be evaporative cooler outlet water.

The manifold 203 can enable back pressure control of the evaporative cooler 218. As described above, in an example the evaporative cooler 218 can include a liquid to air membrane energy exchanger (LAMEE). Given the design of the LAMEE, an important operating parameter is low pressure at the LAMEE outlet. For example, the LAMEE can be operated such that the pressure is maintained at 0.5 psi or lower with minimal fluctuations. The manifold 203 can include a pressure control or regulation device, such as the reservoir 237, which in combination with the piping in the manifold 203 can control the back pressure of the evaporative cooler 218.

The water exiting the evaporative cooler 218 (via the discharge line/EC conduit 211) can flow into the main conduit 213 such that the water can flow to the first pump 230 or the second pump 232, depending on the operating mode. The reservoir 237 can contain water at a specific level that results in pressure on the connector piping 239, which is connected to the main conduit 213. Because the connector piping 239 is fluidically connected and in proximity to the EC conduit 211 at the junction 215, the pressure of the water in the connector piping 239 can control pressure at the junction 215, which is essentially the back pressure for the evaporative cooler 218 or the pressure in the EC conduit 211. The pressure in the connector piping 239 can be controlled closely by monitoring the water level in the reservoir 237.

In an example, the valves 225 and 231 can be used to regulate the water level in the pressure control device/reservoir 237. The valves 225 and 231 can be modulated closed or open together to raise or lower the water level in the reservoir 237.

The junction 215 is shown in FIG. 13 with the EC conduit 211 being in alignment with the connector piping 239. It is recognized that the connector piping 239 is not required to connect to the main conduit 213 specifically at the junction 215 so long as the connector piping 239 connects to the main conduit 213 at a location in proximity to the junction 115.

The design of the manifold 203 can help to prevent air entrainment when the water is pumped through the first and second pumps 230, 232. The piping in the manifold 203, which is essentially completely enclosed, can be flooded in order to minimize or prevent air entrainment. At least a portion of the piping in the manifold 203, including the main conduit 213, can be at an elevation that is lower than the waterline in the reservoir 237 to ensure that the conduit or piping 213 can be fully flooded with water. By contrast, air entrainment in a tank design can be more difficult to control, particularly in a shallow tank in which the pump suction draws a large flow rate and there is the potential for vortex generation and agitation or splashing which can entrain air bubbles.

In the example in which the pressure control device of the manifold 203 is a reservoir, the reservoir can provide additional functionality during the switch over from economizer mode to adiabatic mode or vice versa, from adiabatic mode to economizer mode. To switch to adiabatic mode, the evaporative cooler 218 is filled up with water. Conversely, to switch to economizer mode, the water in the evaporative cooler 218 is drained. The reservoir 237 can be used to provide water to the evaporative cooler 218 during start up (to adiabatic mode) or to house water from the evaporative cooler 218 during shut down (to economizer mode). The connector piping 239 and other piping in the manifold 203 can enable the ability to get water in and out of the reservoir 237 for the evaporative cooler 218

The enclosed design of the manifold 203 can help to minimize thermal losses and can operate more effectively than a tank design in which turbulence and the formation of eddies in the tank can contribute to mixing of hot and cold water. Despite the enclosed or sealed piping design, the main conduit 213 is configured such that hot and cold water can flow between the first and second pumps 130, 132 (i.e. both hot and cold water can flow in both directions within the piping 213) and thus there is still the potential for mixing of hot and cold water in the main conduit 213.

Particularly during peak conditions under the evaporative mode, when the conditioning unit 200 is providing maximum cooling to meet the demands of the heat load, thermal loss can degrade the performance of the unit 200. As such, in the evaporative mode, effective operation of the unit 200 can include preventing hot water from the recovery coil 220 (which is going to the second pump 232) from leaking into the cold water supply (from the evaporative cooler 218 (which is going to the first pump 230). Such leaking can occur, for example, in the piping sections 213B and 213C.

Leaking or mixing of hot water into the cold water supply can be prevented by controlling the flow rates within the unit 200 and more specifically, having different flow rates at different sections of the unit 200. The flow rate through the second pump 232 can be greater than the flow rate through the first pump 230. For example, if the first pump 230 is pulling water at 400 gallons per minute for the cold water supply to the heat load, the second pump 232 can be set to pull water at 420 gallons per minute to the evaporative cooler 218. Thus, there is an extra 20 gallons per minute of cold water exiting the evaporative cooler 218 that is not needed by the first pump 230 for the cold water supply. Such extra or excess cold water can go through the section 213C of the main conduit 213 and towards the second pump 232. As such, the extra cold water can serve to hold the hot water (from the recovery coil 220) back and prevent the hot water from mixing with cold water going to the heat load.

Figure 14:
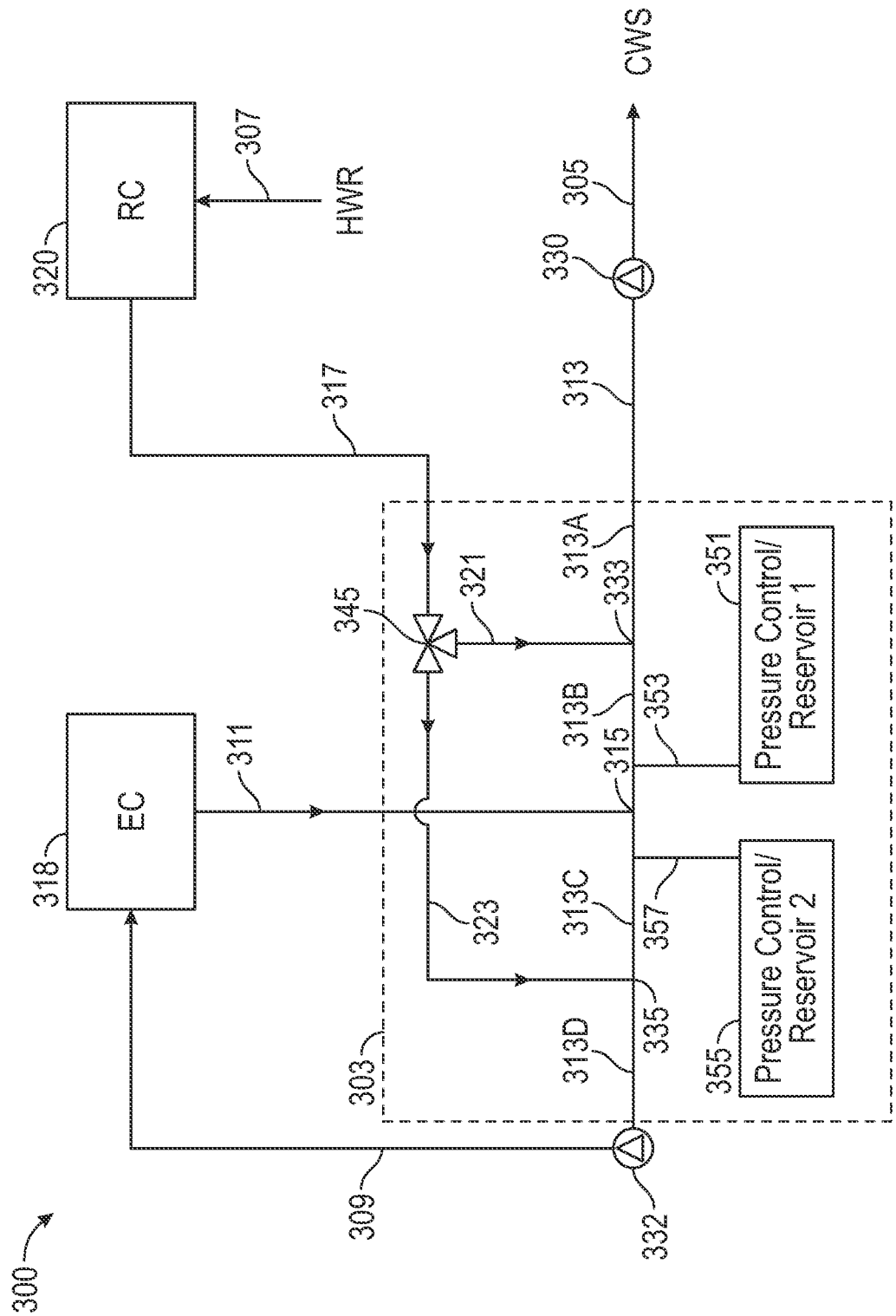
FIG. 14 is a schematic of another example conditioning unit having a manifold for operation in the various modes.

FIG. 14 is a schematic of a conditioning unit 300 that can be configured to generally operate similar to the conditioning unit 200 of FIG. 13. The unit 300 can include an evaporative cooler 318 having an inlet line 309 and an EC conduit/discharge line 311, a recovery coil 320 having a discharge line 317, a manifold 303, and first and second pumps 330, 332. A supply line 305 can deliver cold water (cold water supply, CWS) to a heat load. A return line 307 can deliver hot return water from the heat load to the recovery coil 320.

The manifold 303 can include a three-way modulating valve 345 for controlling a distribution of the water in the RC discharge line into piping 321 (or first RC conduit 321) and piping 323 (or second RC conduit 323). The three-way valve 345 can be part of a flow control device of the manifold 303 and can be used in place of the first and second valves 225, 231 shown in FIG. 13. The position of the valve 345 can be controlled based on the operating mode of the unit 200.

The manifold 303 can include common piping/main conduit 313 which can include piping sections 313A, 313B, 313C and 313D. The EC conduit 311 can connect to the common pipe 313 at a junction 315. The piping 321 can connect to the main conduit 313 at a junction 333 and the piping 323 can connect to the main conduit 313 at a junction 335.

The manifold 303 can include a first pressure control device/reservoir 351 and a second pressure control device/reservoir 355. The first reservoir 351 can be in fluid connection with the main conduit 313 via first connector piping 353 (or first reservoir conduct 353) and the second reservoir 355 can be in fluid connection with the main conduit 313 via second connector piping 357 (or second reservoir conduit 357). The pressure control devices 351 and 355 can operate similar to the pressure control device 237 shown in FIG. 13. The first connector piping 353 and second connector piping 357 can be short piping sections that can each be located in proximity to the junction 315 such that the connector piping 353, 357 can be used to control the back pressure of the evaporative cooler 318.

FIG. 14 provides another example, in addition to FIG. 13, of a manifold design for operating a conditioning unit in the various modes described herein, including a blended mode of the adiabatic and evaporative modes. FIG. 14 shows a three-way valve and two reservoirs in the manifold. It is recognized that a manifold design can include, in one example, the two valves 225, 231 in FIG. 13 with a two-reservoir design and, in another example, can include the three-way valve 345 with a single reservoir design.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

Various aspects of the disclosure have been described. These and other aspects are within the scope of the following claims.

What is claimed is:

1. A conditioning system configured to provide cooling to a heat load, the conditioning system comprising:
   a plenum having an air inlet and air outlet, the plenum configured to direct air in an air flow path from the air inlet to the air outlet;
   an evaporative cooler arranged inside the plenum in the air flow path and configured to circulate a cooling liquid from an EC inlet through the evaporative cooler to an EC outlet and to exchange energy between the cooling liquid and the air;
   a recovery coil arranged inside the plenum between the evaporative cooler and the air outlet and configured to circulate the cooling liquid from an RC inlet through the recovery coil to an RC outlet and to exchange heat between the cooling liquid and the air; and a manifold liquidically connected to the EC outlet and the RC outlet and configured to variably distribute the cooling liquid to at least one of the heat load and the EC inlet based on the operating mode and environmental conditions, the manifold including a flow control device for variable distribution of the cooling liquid to the heat load and the EC inlet.

2. The conditioning system of claim 1 wherein the manifold comprises:

a main conduit connected to the EC inlet and the heat load, the main conduit configured to supply the cooling liquid to the heat load;

an EC conduit connected to the RC outlet and the main conduit;

a first RC conduit connected to the RC outlet and the main conduit;

a second RC conduit connected to the RC outlet and the main conduit; and a pressure regulation device to control a pressure of the cooling liquid at the EC outlet.

3. The conditioning system of claim 2, wherein the cooling liquid supplied to the heat load comprises at least one of:

substantially all of the cooling liquid from the RC outlet and substantially none of the cooling liquid from the EC outlet, substantially none of the cooling liquid from the RC outlet and substantially all of the cooling liquid from the EC outlet, and a mixture of the cooling liquid from the RC outlet and the cooling liquid from the EC outlet.

4. The conditioning system of claim 3 wherein the cooling liquid to the EC inlet from the main conduit comprises at least one of:

substantially all of the cooling liquid from the RC outlet and substantially none of the cooling liquid from EC outlet;

substantially none of the cooling liquid from the RC outlet and substantially all of the cooling liquid from EC outlet; and a mixture of the cooling liquid from the RC outlet and the cooling liquid from the EC outlet.

5. The conditioning system of claim 3, wherein the EC conduit is connected to the main conduit between the connection of the first RC conduit to the main conduit and the connection of the second RC conduit to the main conduit.

6. The conditioning system of claim 3, wherein the flow control device variably distributes the cooling liquid from the RC outlet to one or both of the first and second RC conduits.

7. The conditioning system of claim 3, wherein the EC conduit connects to the main conduit at a T-junction.

8. The conditioning system of claim 3, wherein the first RC conduit is connected to the main conduit at a first RC junction on one side of the T-junction, and wherein the second RC conduit is connected to the main conduit at a second junction on the other side of the T-junction.

9. The conditioning system of claim 3, wherein the pressure regulation device includes at least one reservoir having a controlled level of water and liquidically connected to the main conduit, the controlled level of water selected to set the pressure of the cooling liquid in the evaporative cooler.

10. The conditioning system of claim 3, further comprising:

a first pump liquidically connected to the manifold and configured to deliver the cooling liquid to the heat load; and a second pump liquidically connected to the manifold and configured to deliver the cooling liquid to the EC inlet.

11. The conditioning system of claim 3, wherein the flow control device includes a first valve in the first RC conduit and a second valve in the second RC conduit.

12. The conditioning system of claim 3, wherein the flow control device includes a three-way modulating valve between the RC outlet and the first and second RC conduits.

13. The conditioning system of claim 1, wherein the evaporative cooler is a liquid-to-air membrane energy exchanger (LAMEE), and the cooling liquid is separated from the air flow path by a membrane, the LAMEE configured to condition the scavenger air and evaporatively cool the cooling liquid.

14. The conditioning system of claim 1 further comprising:

a pre-cooler arranged inside the scavenger plenum between the air inlet and the evaporative cooler, the pre-cooler configured to selectively condition the scavenger air prior to passing the scavenger air through the evaporative cooler, based on the outdoor air conditions.

15. The conditioning system of claim 1, wherein the conditioning system is configured to operate in one or more of an adiabatic mode, an evaporative mode, and a blended mode;

in the adiabatic mode, the flow control device distributes substantially all of the cooling liquid from the RC outlet and substantially none of the cooling liquid from EC outlet to the heat load;

in the evaporative mode, the flow control device distributes substantially none of the cooling liquid from the RC outlet and substantially all of the cooling liquid from EC outlet to the head load; and in the blended mode, the flow control device distributes a mixture of the cooling liquid from the RC outlet and the cooling liquid from the EC outlet.

* * * * *